United States Patent
Subramanian et al.

(10) Patent No.: US 9,336,885 B1
(45) Date of Patent: May 10, 2016

(54) READING AND WRITING TO NAND FLASH MEMORIES USING CHARGE CONSTRAINED CODES

(71) Applicant: SK hynix memory solutions inc., San Jose, CA (US)

(72) Inventors: Arunkumar Subramanian, San Jose, CA (US); Frederick K. H. Lee, Mountain View, CA (US); Xiangyu Tang, San Jose, CA (US); Lingqi Zeng, Turlock, CA (US); Jason Bellorado, San Jose, CA (US)

(73) Assignee: SK Hynix Memory Solutions Inc., San Jose, CA (US)

( * ) Notice: Subject to any disclaimer, the term of this patent is extended or adjusted under 35 U.S.C. 154(b) by 247 days.

(21) Appl. No.: 13/900,861

(22) Filed: May 23, 2013

Related U.S. Application Data

(60) Provisional application No. 61/654,709, filed on Jun. 1, 2012, provisional application No. 61/664,539, filed on Jun. 26, 2012.

(51) Int. Cl.
*G11C 16/04* (2006.01)
*G11C 16/06* (2006.01)
*G11C 16/10* (2006.01)
*G11C 16/26* (2006.01)

(52) U.S. Cl.
CPC ............... *G11C 16/10* (2013.01); *G11C 16/26* (2013.01)

(58) Field of Classification Search
CPC ................... G11C 16/10; G11C 16/26
USPC ............. 365/185.09, 185.18, 185.19, 185.33; 714/795, 796, 799
See application file for complete search history.

(56) References Cited

U.S. PATENT DOCUMENTS

| 8,533,576 B1 * | 9/2013 | Wu | H04L 1/0041 714/799 |
| 2011/0286271 A1 * | 11/2011 | Chen | G11C 7/1006 365/185.09 |

* cited by examiner

*Primary Examiner* — Tha-O H Bui
(74) *Attorney, Agent, or Firm* — IP & T Group LLP

(57) ABSTRACT

A charge constrained bit sequence is processed to obtain a lower bound on a number of bit errors associated with the charge constrained bit sequence. The lower bound is compared against an error correction capability threshold associated with an error correction decoder. In the event the lower bound is greater than or equal to the error correction decoder threshold, an error correction decoding failure is predicted.

20 Claims, 28 Drawing Sheets

States corresponding to RDS value for segments up to and including segment i

States corresponding to RDS value for segments up to and including segment i+1

Charge Constrained Bit Sequence

READING AND WRITING TO NAND FLASH MEMORIES USING CHARGE CONSTRAINED CODES

CROSS REFERENCE TO OTHER APPLICATIONS

This application claims priority to U.S. Provisional Patent Application No. 61/654,709 entitled OPTICAL READ-THRESHOLD ESTIMATION WITH CHARGE-CONSTRAINED CODES FOR NAND FLASH MEMORIES filed Jun. 1, 2012 which is incorporated herein by reference for all purposes and to U.S. Provisional Patent Application No. 61/664,539 entitled BOUNDING THE BIT-ERROR RATE AND EARLY DECODER TERMINATION FOR SEQUENCES ENCODED USING THE POLARITY SWITCH METHOD IN NAND FLASH STORAGE DEVICES filed Jun. 26, 2012 which is incorporated herein by reference for all purposes.

BACKGROUND OF THE INVENTION

Solid state storage systems, such as NAND Flash systems, often use error correction codes to correct the noisy data read back from the solid state storage. In some cases, the read back data contains a relatively large amount of noise and an error correction decoder takes longer than usual to decode, which is undesirable because the throughput of the system may drop below an acceptable level and/or more power is consumed than is desirable from the additional processing cycles. Improved read and/or write techniques which are able to conserve power and/or improve throughput would be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Read and write techniques which use charge constrained codes are described herein. First, embodiments of write techniques which use charge constrained codes are discussed. For example, a write processor may be configured to store (e.g., in solid state storage) bit sequences that have running digital sum (RDS) values and are bounded or constrained by one or more limits. Then, embodiments of read techniques which use charge constrained codes are discussed. For example, a read processor may know that the data which is stored has had some constraint applied to it (e.g., there is a bound or limit on the RDS value of the stored bit sequence). The read processor may use this information when performing processing on the read back data. Note that the exemplary read and write techniques described herein are not required to be used with each other. The write techniques described herein may be used with read techniques which are not described herein; the converse is also true.

Figure 1:
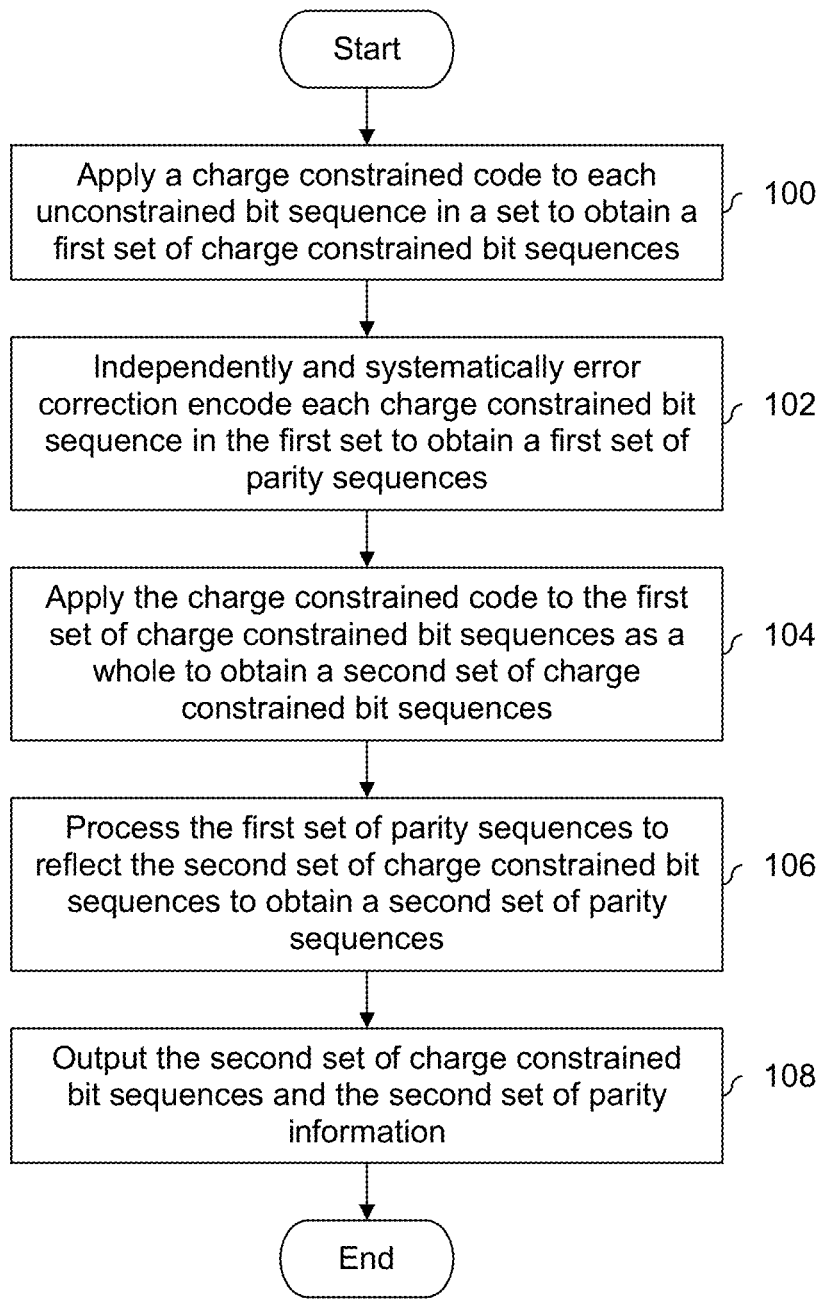
FIG. 1 is a flowchart illustrating an embodiment of a process for writing to solid state storage using a charge constrained code.

FIG. 1 is a flowchart illustrating an embodiment of a process for writing to solid state storage using a charge constrained code. In the example shown, the process is performed by a write processor in a storage system. At 100, a charge constrained code is applied to each unconstrained bit sequence in a set to obtain a first set of charge constrained bit sequences. For example, if there are 4 bit sequences, the first unconstrained bit sequence is processed to obtain a first charge constrained sequence, the second unconstrained bit sequence is processed to obtain a second charge constrained sequence, and so on. How a charge constrained code is applied to a bit sequence to obtain a charge constrained bit sequence is described in further detail below.

A charge constrained code used at step 100 is a code that enforces one or more rules on a sequence of bits. One example of a charge constrained code is a DC free code that produces bit sequences which have an equal number of 1s and 0s. Another example of a charge constrained code is a running digital sum (RDS) constrained code where the excess number of 0s (or 1s) over some bit sequence is bounded (i.e., is guaranteed not to exceed some value). Given a bit sequence $x=(x_1, x_2, \ldots, x_n)$ with $x_i \in \{0, 1\}$ for all i, the running digital sum at bit j is defined as:

$$\sigma_g(j) = \left(\sum_{i=1}^{j} x_j\right) - \frac{j}{2} \quad (1)$$

Put another way, $\sigma_g(j)$ describes the number of excess 1s in the first j locations of the bit sequence string. For example, $\sigma_g(j=4)=0$ for the bit sequence $(1,1,0,0)$, $\sigma_g(j=4)=-2$ for the bit sequence $(0,0,0,0)$, and $\sigma_g(j=4)=2$ for the bit sequence $(1,1,1,1)$. Although some embodiments described herein discuss constraining an excess number of 1s, naturally, other embodiments may constrain an excess number of 0s. In some embodiments, a charge constrained code used at step 100 has the following property: given any unconstrained sequence X and its charge constrained counterpart Y, the charge constrained code should be such that "complement(Y)" is also a valid charge constrained sequence. Moreover, "complement (Y)" should map back to X.

At 102, each charge constrained bit sequence in the first set is independently and systematically error correction encoded to obtain a first set of parity sequences. By independent, it is meant that each charge constrained bit sequence is encoded without using another charge constrained bit sequence. As a result, when read back, it is not necessary when error correction decoding a given charge constrained bit sequence to have access to information associated with another bit sequence. By systematic, it is meant that the payload or input to the encoding process is reproduced or otherwise included in the encoded output. For example, if the payload or input is the bit sequence $x=(x_1, x_2, \ldots, x_n)$ then the entire encoded result is $(x_1, x_2, \ldots, x_n, p_1, \ldots, p_k)$ where the parity sequence $p=(p_1, p_2, \ldots, p_k)$ follows the payload or input. Note that the portion of the encoded output corresponding to the input or payload (i.e., $x=(x_1, x_2, \ldots, x_n)$) still has an RDS value which is bounded, but that property does not necessarily hold true for the parity sequence.

At 104, the charge constrained code is applied to the first set of charge constrained bit sequences as a whole to obtain a second set of charge constrained bit sequences. To continue the example from above, the 4 charge constrained bit sequences, when evaluated as a single bit sequence, have some RDS value prior to processing at step 104. After processing at 104, that RDS value is bounded by some limit. In some embodiments, the processing at 104 does not undo or loosen any constraint applied at step 100, so any constraint applied at step 100 still holds (at least in such embodiments).

At 106, the first set of parity sequences is processed to reflect the second set of charge constrained bit sequences to obtain a second set of parity sequences. Step 106 bypasses an error correction encoder (e.g., used at step 102). A simpler and/or faster operation (e.g., a Boolean and/or combinational operation) may be used at 106 instead of using an encoder. This is attractive because Boolean logic may consume less power and/or it frees up the encoder for use by another piece of data.

At 108, the second set of charge constrained bit sequences and the second set of parity sequences are output. For example, they may be stored in solid state storage (e.g., NAND Flash). In some embodiments, other information (e.g., in addition to the second set of charge constrained bit sequences and the second set of parity information) is also stored.

The following figures show an example of a set of bit sequences processed according to the process of FIG. 1.

Figure 2:
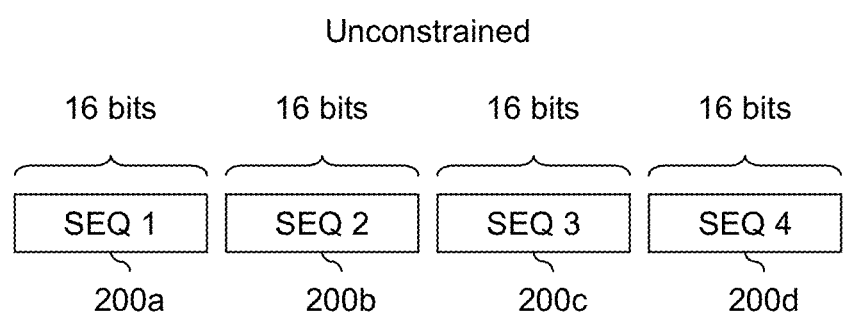
FIG. 2 is a diagram showing an embodiment of 4 bit sequences of unconstrained data.

FIG. 2 is a diagram showing an embodiment of 4 bit sequences of unconstrained data. In the example shown, each of bit sequences 200a-200d is 16 bits long. In the following figures, bit sequences 200a-200d are processed according to the process shown in FIG. 1. Note that the lengths and/or sizes described herein are merely exemplary.

Figure 3:
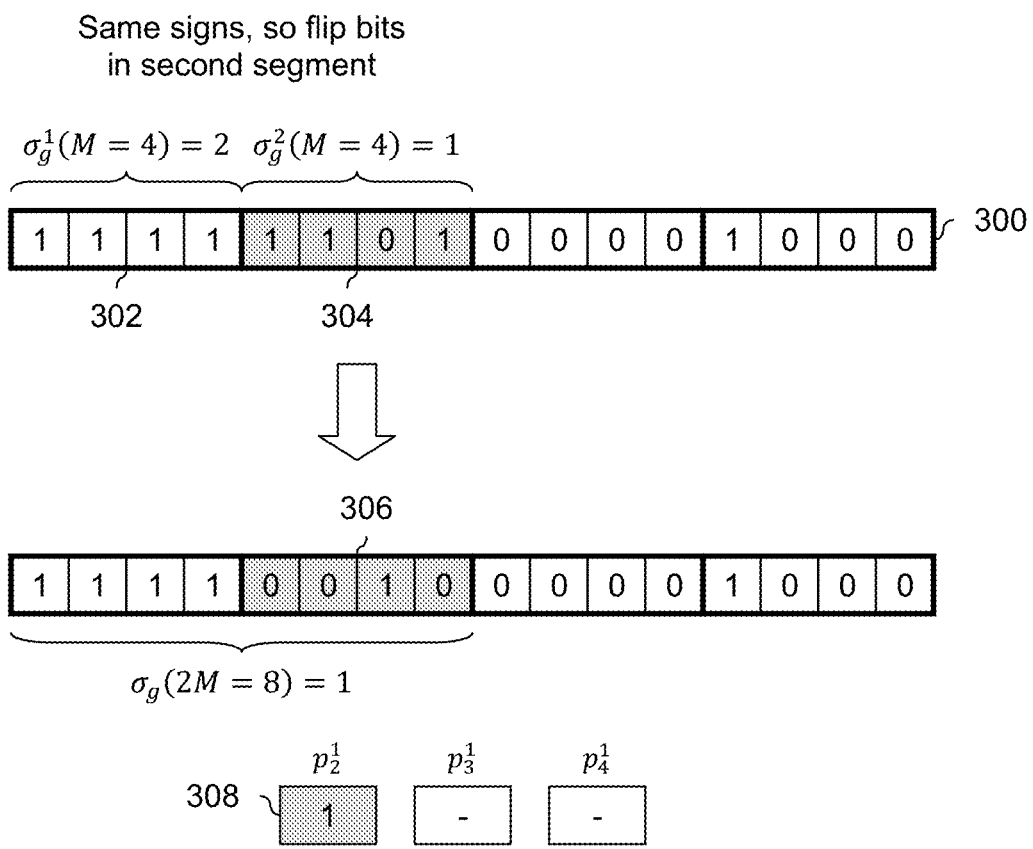
FIG. 3 is a diagram showing an embodiment of deciding whether to flip a second segment in a bit sequence.

FIG. 3 is a diagram showing an embodiment of deciding whether to flip a second segment in a bit sequence. In the example shown, first bit sequence 200a in FIG. 2 is being processed. Bit sequence 300 is segmented into segments of length M. In this example, since bit sequence 300 is 16 bits long and M=4, there are 4 segments. The RDS for first segment 302, $x^1(M)=(x_1, x_2, \ldots, x_M)$, is calculated as:

$$\sigma_g^1(M) = \left(\sum_{i=1}^{M} x_j\right) - \frac{M}{2} \quad (2)$$

where the superscript indicates that this is for the first segment. In this example, the RDS for first segment 302 is $\sigma_g^1(M=4)=2$. The value of $\sigma_g^1(M)$ is in the interval or range [−M/2, M/2] (i.e., it is bounded by or limited by −M/2 and M/2), where the minimum and maximum values are obtained from the all 0s and all 1s sequences, respectively.

The RDS for second segment 304 is calculated as:

$$\sigma_g^2(M) = \left(\sum_{j=M+1}^{2M} x_j\right) - \frac{M}{2}, \quad (3)$$

and as before with $\sigma_g^1(M)$, $-M/2 \leq \sigma_g^2(M) \leq M/2$. In this example, the RDS of second segment 304 is $\sigma_g^2(M=4)=1$.

If the signs of $\sigma_g^1(M)$ and $\sigma_g^2(M)$ are the same, then the second segment is flipped. This is the case in FIG. 3, since $\sigma_g^1(M)=2$ and $\sigma_g^2(M)=1$ and so the signs of both are positive. As a result, second segment 304 is flipped to become flipped second segment 306. If the signs of $\sigma_g^1(M)$ and $\sigma_g^2(M)$ were different or one of the RDS values were 0, then the second segment would not be flipped.

To track that the second segment has been flipped, second polarity bit $p_2^1$ (308) is set to a 1 to indicate that the corresponding segment (in this case, second segment 304/306) has been flipped. A decoder or read processor will use the polarity information to reconstruct the original bit sequence 300. Since the first segment always remains the same according to this exemplary RDS constraint processing, there is no polarity bit for the first segment.

With the second segment flipped, the RDS for the first 2M bits (i.e., the first two segments) is:

$$\sigma_g(2M) = \sigma_g^1(M) \pm \sigma_g^2(M) \quad (4)$$

where the addition or subtraction operation in Equation (4) is chosen such that the signs of $\sigma_g^1(M)$ and $\sigma_g^2(M)$ are opposite (i.e., similar to the rules described above for whether or not to flip the second segment). In this example, $\sigma_g(2M=8)=1$.

Figure 4:
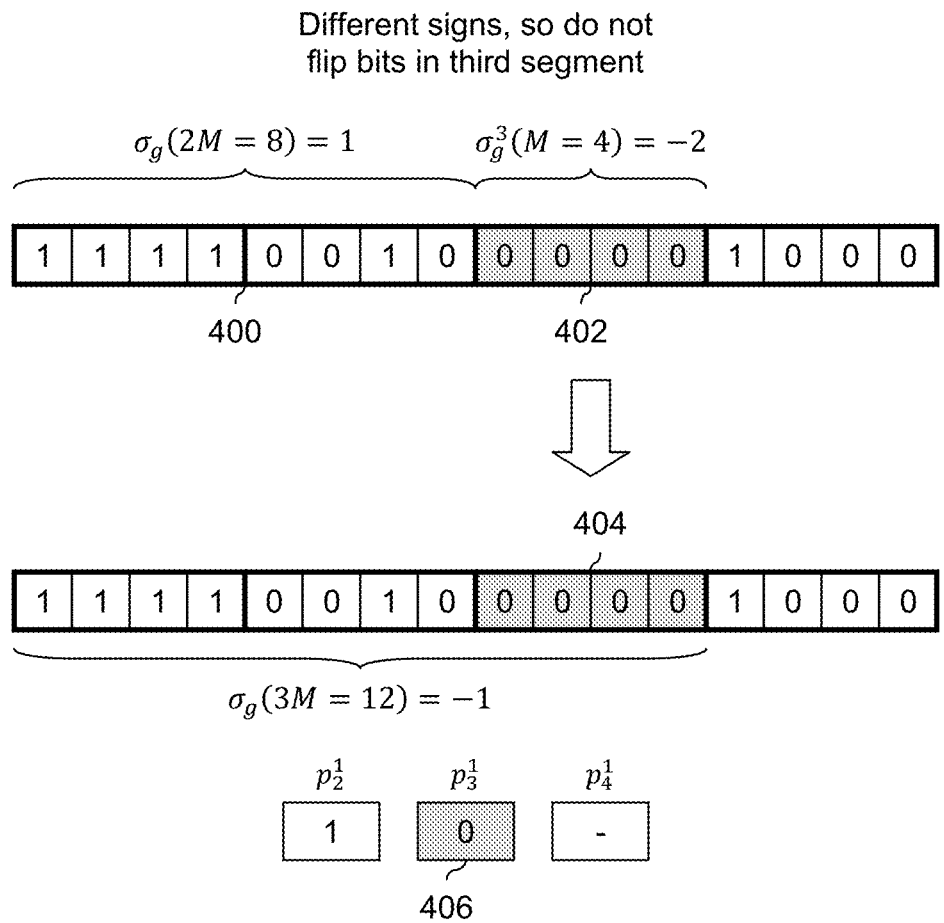
FIG. 4 is a diagram showing an embodiment of deciding whether to flip a third segment in a bit sequence.

FIG. 4 is a diagram showing an embodiment of deciding whether to flip a third segment in a bit sequence. FIG. 4 follows the example of FIG. 3. The RDS of the segments which have been processed so far is calculated. In this example, $\sigma_g(2M=8)=1$ for first and second segments 400. The sign of $\sigma_g(2M=8)$ is compared to the RDS of third segment 402 and the rules described above are used to decide whether or not to flip third segment 402. Since $\sigma_g(2M=8)=1$ and $\sigma_g^3(M=4)=-2$ and the signs are opposite, third segment 402 is not flipped and stays the same in 404. Third polarity bit $p_3^1$ (406) is set to a 0 to indicate that the corresponding segment 402/404 is not flipped. The RDS for the first 12 bits (i.e., the first three segments) after processing is thus $\sigma_g(3M=12)=-1$ in this example.

Figure 5:
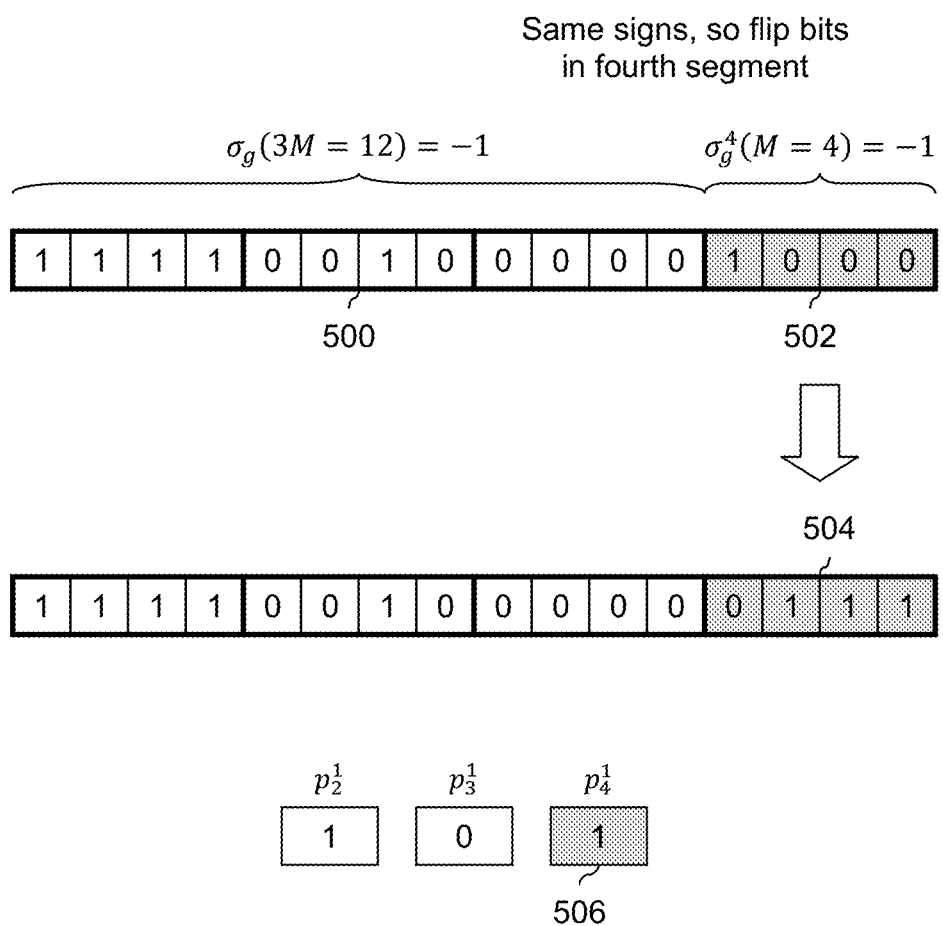
FIG. 5 is a diagram showing an embodiment of deciding whether to flip a fourth segment in a bit sequence.

FIG. 5 is a diagram showing an embodiment of deciding whether to flip a fourth segment in a bit sequence. FIG. 5 follows the example of FIG. 4. The RDS of the segments which have been processed so far is calculated. In this example, $\sigma_g(3M=12)=-1$ for the first through third segments (500). The RDS of fourth segment 502 is calculated to be $\sigma_g^4(M=4)=-1$. Since the two RDS values have the same sign, fourth segment 502 is flipped to become flipped fourth segment 504 and fourth polarity bit $p_4^1$ (506) is set to 1 to record this flipping.

Figure 6:
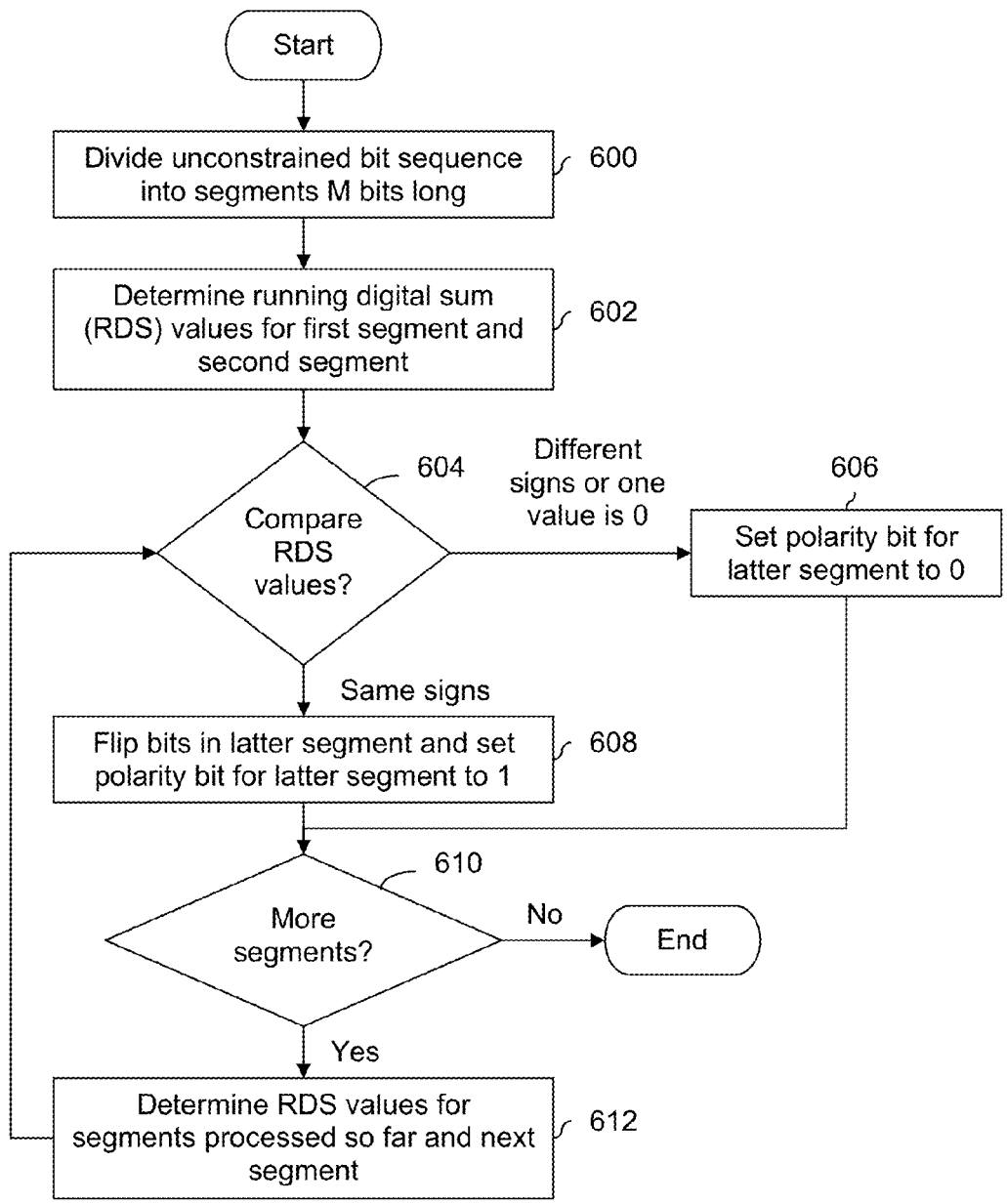
FIG. 6 is a flowchart illustrating an embodiment of a process for applying a charge constrained code to an unconstrained bit sequence.

FIG. 6 is a flowchart illustrating an embodiment of a process for applying a charge constrained code to an unconstrained bit sequence. In some embodiments, the process of FIG. 6 is used (e.g., repeatedly and independently) on each of the unconstrained bit sequences in a set at step 100 in FIG. 1. At 600, an unconstrained bit sequence is divided into segments M bits long. For example, in FIG. 3, bit sequence 300 is divided into 4 segments each of which is 4 bits long. At 602, running digital sum (RDS) values are determined for a first segment and a second segment. For example, for first segment 302 in FIG. 3, $\sigma_g^1(M=4)=2$ and for second segment 304, $\sigma_g^2(M=4)=1$.

At 604, the RDS values are compared. If the signs are different or one value is 0, then at 606, a polarity bit for the latter segment is set to 0. See, for example, FIG. 4 where third polarity bit 406 is set to 0. If the signs are determined to be the same at 604, then at 608, the bits in the latter segment are flipped and the polarity bit for the latter segment is set to 1. See, for example, polarity bit 308 and flipped bit sequence 306 in FIG. 3 and polarity bit 506 and flipped bit sequence 504 in FIG. 5.

After step 606 or 608, it is determined at 610 if there are more segments. If so, RDS values are determined for the segments processed so far and a next segment at 612. The two RDS values are then compared at 604.

Figure 7:
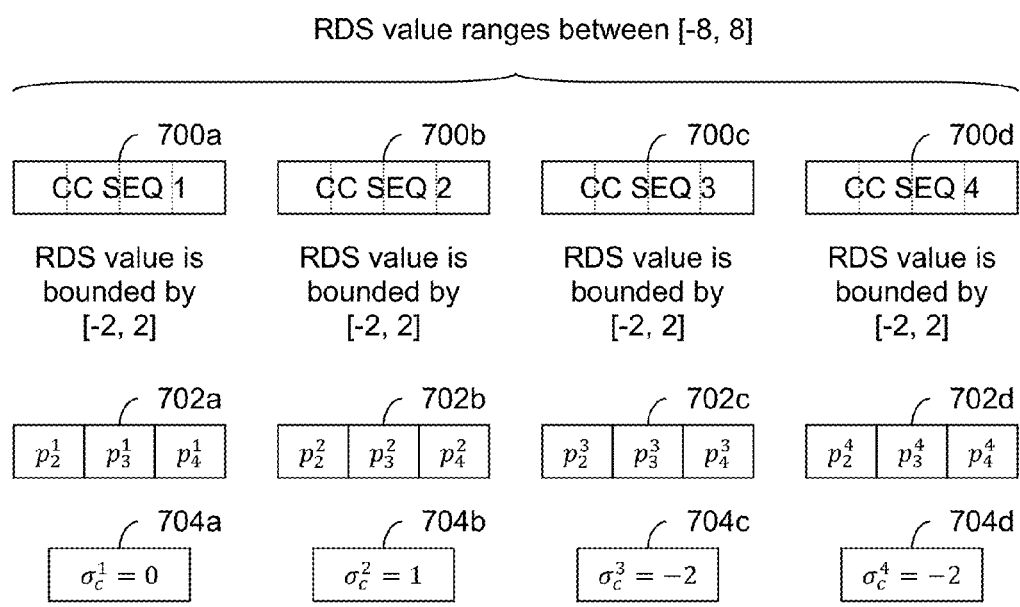
FIG. 7 is a diagram showing an embodiment of a first set of charge constrained bit sequences.

FIG. 7 is a diagram showing an embodiment of a first set of charge constrained bit sequences. In the example shown, unconstrained bit sequence 200*a* in FIG. 2 has been processed to produce charge constrained bit sequence 700*a*, polarity sequence 702*a*, and RDS value 704*a*; unconstrained bit sequence 200*b* in FIG. 2 has been processed to produce charge constrained bit sequence 700*b*, polarity sequence 702*b*, and RDS value 704*b*; unconstrained bit sequence 200*c* in FIG. 2 has been processed to produce charge constrained bit sequence 700*c*, polarity sequence 702*c*, and RDS value 704*c*; unconstrained bit sequence 200*d* in FIG. 2 has been processed to produce charge constrained bit sequence 700*d*, polarity sequence 702*d*, and RDS value 704*d*. Note that at this stage of processing, each of charge constrained bit sequences 700*a*-700*d* individually has an RDS value which is bounded by [−2, 2], but the RDS value of bit sequences 700*a*-700*d* when evaluated as a whole can range from −8 to 8.

Returning to FIG. 1, error correction encoding is performed at step 102. The following figure shows an example of this performed on the information shown in FIG. 7.

Figure 8:
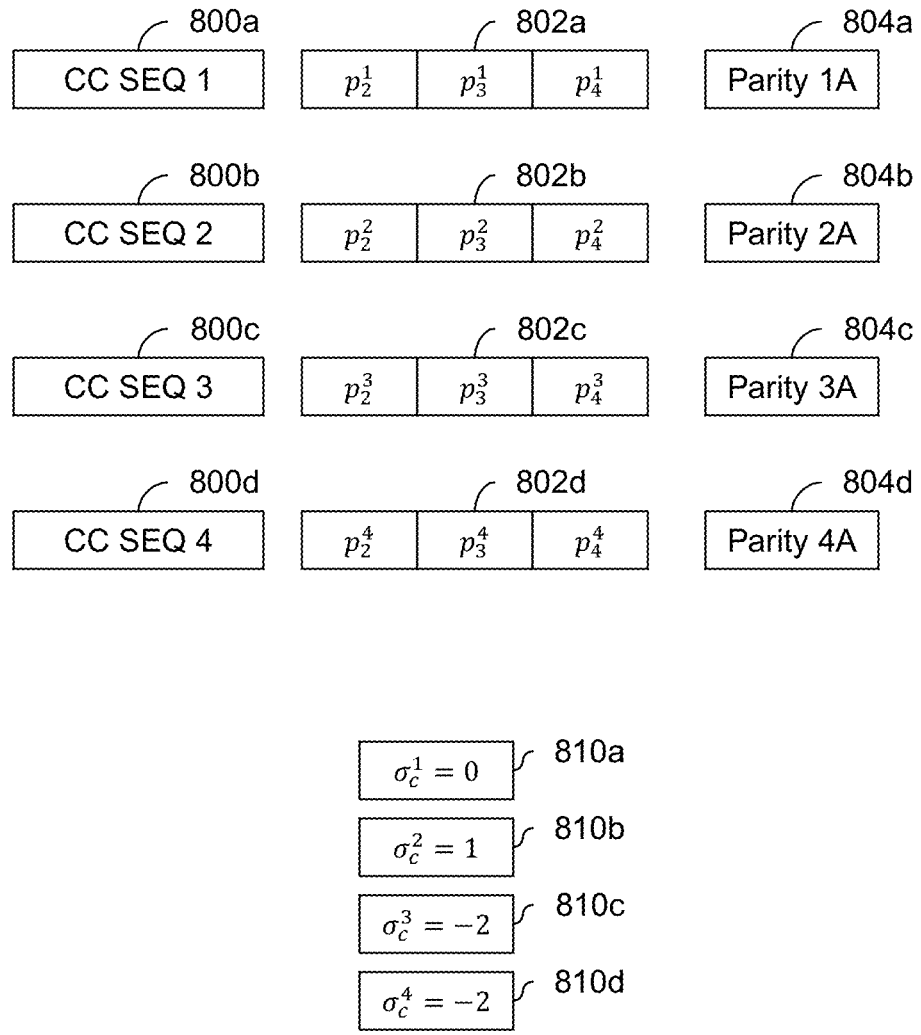
FIG. 8 is a diagram showing an embodiment of a first set of parity sequences.

FIG. 8 is a diagram showing an embodiment of a first set of parity sequences. FIG. 8 continues the example of FIG. 7. In the example shown, a systematic and linear error correction code is used to generate parity sequences 804*a*-804*d* using (respectively) charge constrained bit sequence 800*a* and polarity information 802*a*, charge constrained bit sequence 800*b* and polarity information 802*b*, charge constrained bit sequence 800*c* and polarity information 802*c*, and charge constrained bit sequence 800*d* and polarity information 802*d*. RDS values 810*a*-810*d* are not used to generate parity information 804*a*-804*d* in this example.

Returning to FIG. 1, at step 104, a charge constrained code is applied to the first set of charge constrained bit sequences as a whole. The following figures show an example of this performed on the information shown in FIG. 8.

Figure 9:
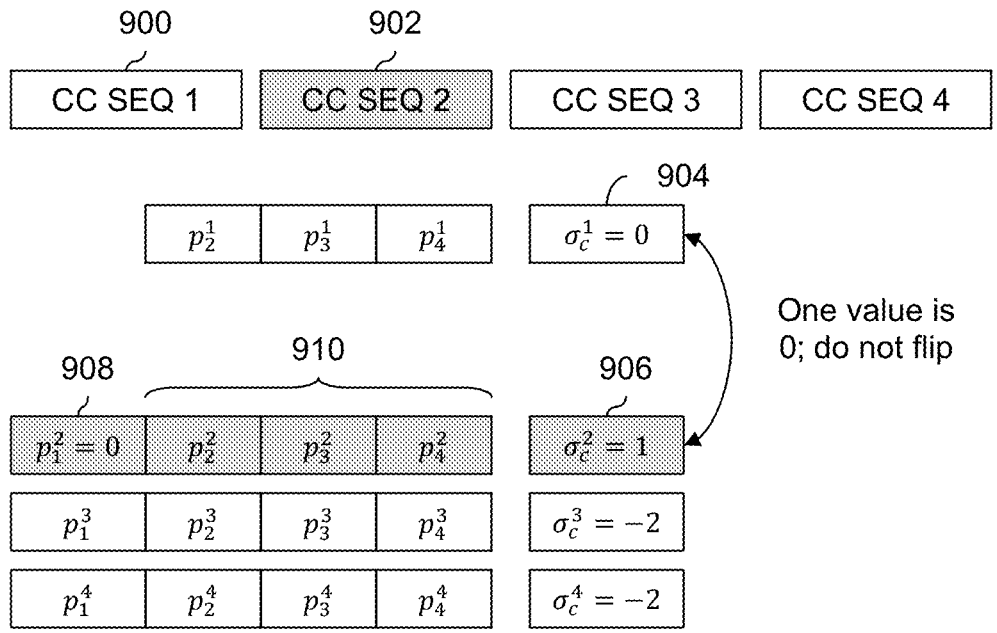
FIG. 9 is a diagram showing an embodiment of deciding whether to flip a second charge constrained bit sequence.
Figure 9:
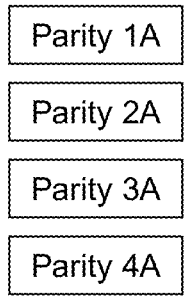

FIG. 9 is a diagram showing an embodiment of deciding whether to flip a second charge constrained bit sequence. FIG. 9 continues the example of FIG. 8. In this example, the RDS value for the first charge constrained bit sequence (900) is compared to the RDS value for the second charge constrained bit sequence (902). In other words $\sigma_c^1=0$ (904) is compared to $\sigma_c^2=1$ (906). Since one value is 0, second charge constrained bit sequence 902 and second parity information 910 are not flipped and the sign of second RDS value 906 remains the same. Since nothing is changed, the corresponding polarity bit $p_1^2$ (908) is set to 0. Note that first charge constrained bit sequence 900 is not eligible for flipping, so there is no corresponding polarity bit for first charge constrained bit sequence 900 (i.e., there is no $p_1^1$).

Figure 10:
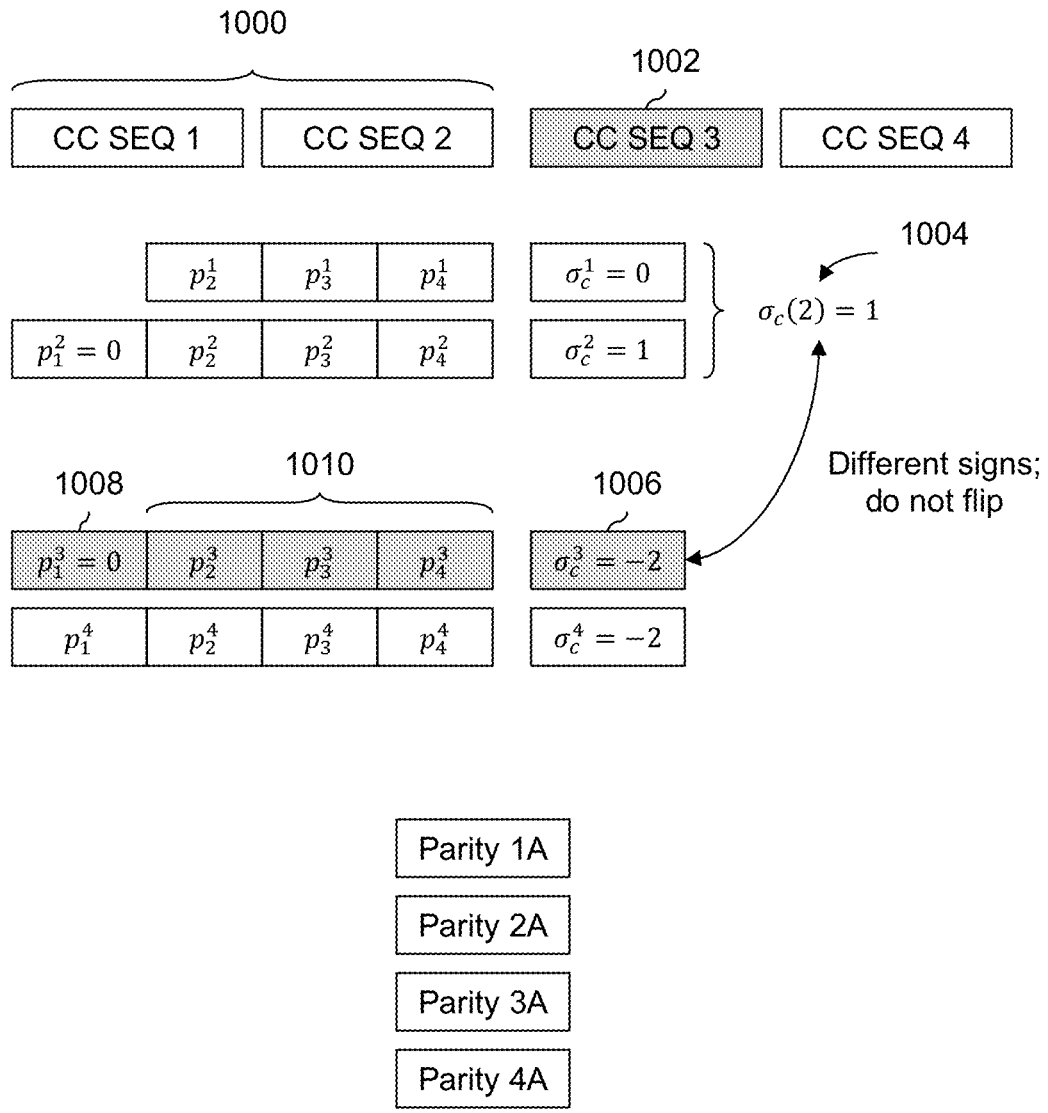
FIG. 10 is a diagram showing an embodiment of deciding whether to flip a third charge constrained bit sequence.

FIG. 10 is a diagram showing an embodiment of deciding whether to flip a third charge constrained bit sequence. FIG. 10 continues the example of FIG. 9. In this example, the RDS value $\sigma_c(2)$ for the already-processed bit sequences (1000) is compared against the RDS of the third charge constrained bit sequence (1002). Since $\sigma_c(2)=1$ (1004) and $\sigma_c^3=-2$ (1006) have different signs, third charge constrained bit sequence 1002 and third parity information 1010 are not flipped and the sign of third RDS value 1006 remains the same. Polarity bit $p_1^3$ (1008) is set to 0 since nothing is changed.

Figure 11:
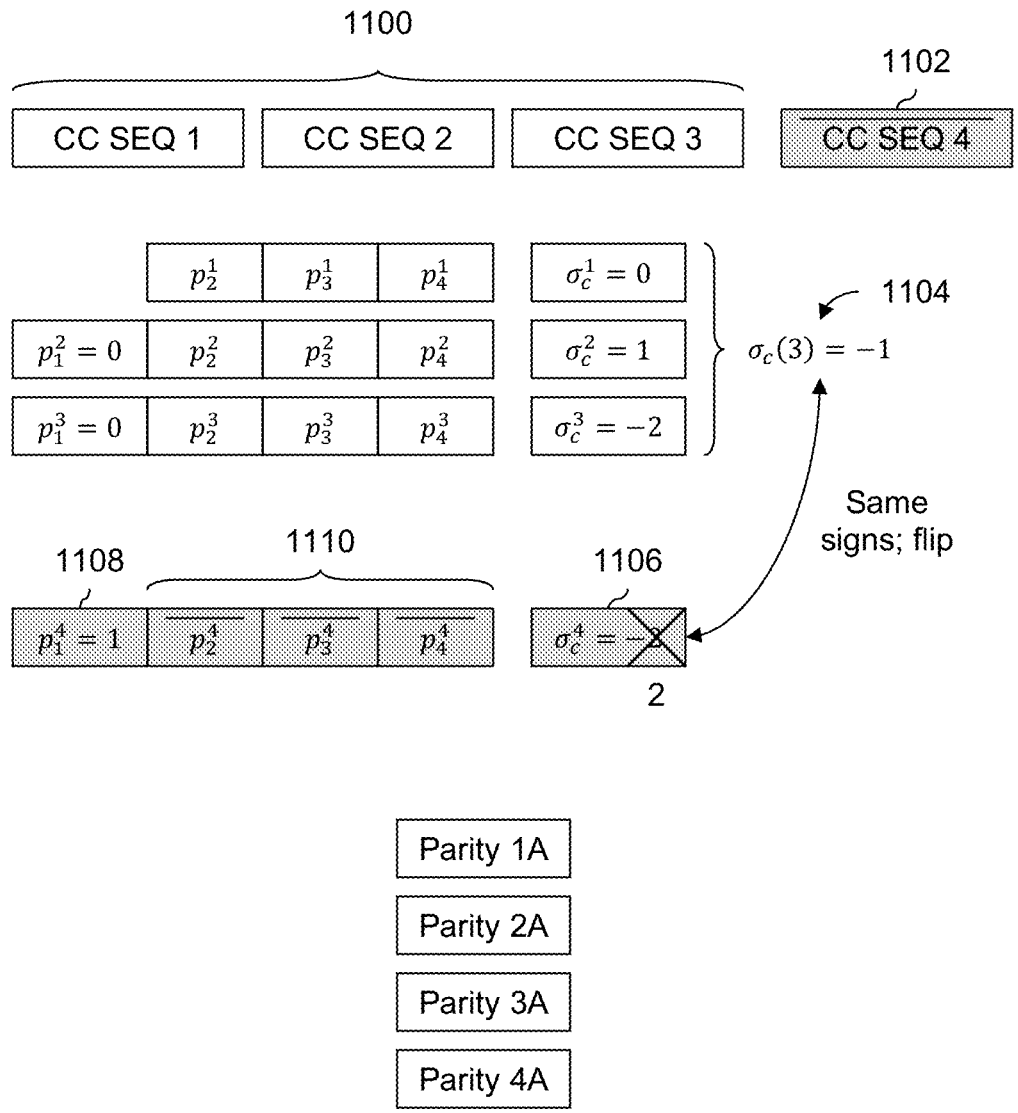
FIG. 11 is a diagram showing an embodiment of deciding whether to flip a fourth charge constrained bit sequence.

FIG. 11 is a diagram showing an embodiment of deciding whether to flip a fourth charge constrained bit sequence. FIG. 11 continues the example of FIG. 10. In this example, the RDS value $\sigma_c(3)$ of already-processed bit sequences 1100 is $\sigma_c(3)=-1$ (1104) and the RDS value of the fourth charge constrained bit sequence (1102) is $\sigma_c^4=-2$. Since both have the same sign (i.e., negative), fourth charge constrained bit sequence (1102) and polarity information 1110 are flipped and the sign of RDS value 1106 is changed from negative to positive. As used herein, a "‾" indicates bit flipping (e.g., if x=(0,0,1,0) then x̄=(1,1,0,1)). To record these changes, polarity bit $p_1^4$ (1108) is set to 1.

Figure 12:
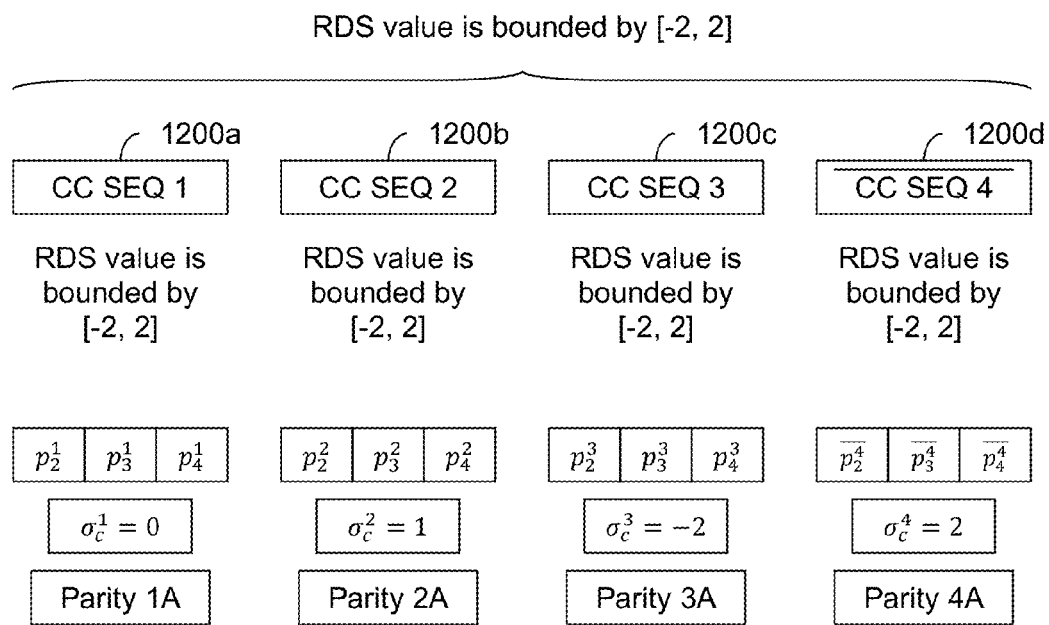
FIG. 12 is a diagram showing an embodiment of a second set of charge constrained bit sequences.

FIG. 12 is a diagram showing an embodiment of a second set of charge constrained bit sequences. Bit sequences 1200a-1200d are an example of the data which is output by step 104 in FIG. 1. Like FIG. 7, each of bit sequences 1200a-1200d (individually) has an RDS value which is bounded by [−2, 2]. Unlike FIG. 7, however, when evaluated as a whole, bit sequences 1200a-1200d have an RDS value which is bounded by [−2, 2] as opposed to [−8, 8] as in FIG. 7. In other words, step 104 in FIG. 1 tightens the bound on the RDS value of bit sequences 1200a-1200d as a whole.

Figure 13:
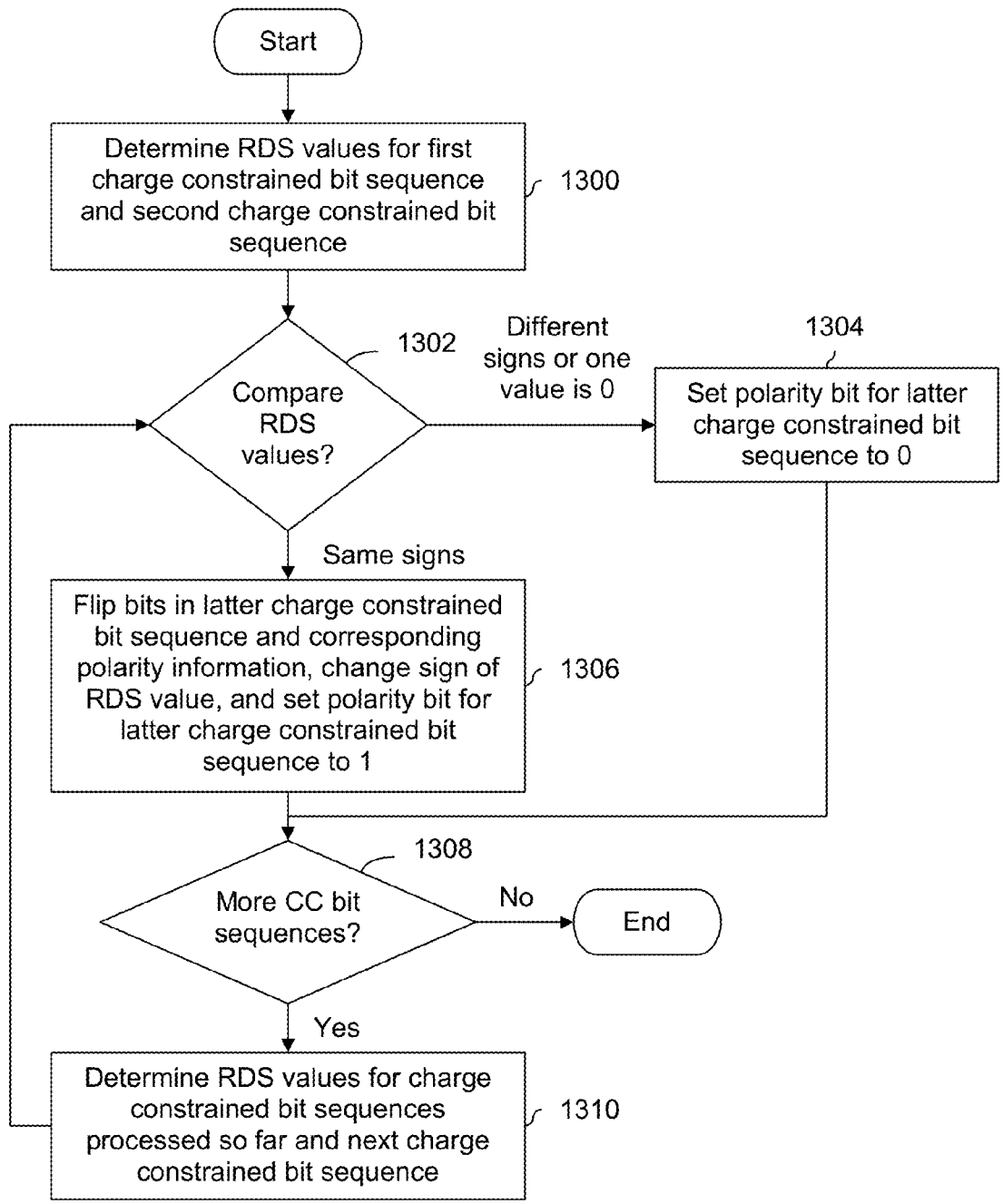
FIG. 13 is a flowchart illustrating an embodiment of a process for applying a charge constrained code to a first set of charge constrained bit sequences as a whole.

FIG. 13 is a flowchart illustrating an embodiment of a process for applying a charge constrained code to a first set of charge constrained bit sequences as a whole. In some embodiments, the process of FIG. 13 is used at step 104 in FIG. 1. At 1300, RDS values are determined for a first charge constrained bit sequence and a second charge constrained bit sequence. At 1302, the RDS values are compared. If they have different signs or one value is 0, then at 1304 the polarity bit for the latter charge constrained bit sequence is set to 0. See, for example FIGS. 9 and 10. If they have the same signs, then at 1306, the bits in the latter charge constrained bit sequence and corresponding polarity information are flipped, the sign of the RDS value is changed, and the polarity bit for the latter charge constrained bit sequence is set to 1. See, for example, FIG. 11. After steps 1304 or 1306, it is determined if there are more charge constrained bit sequences at 1308. If so, the RDS values for the charge constrained bit sequences processed so far and a next charge constrained bit sequence are determined at 1310.

Returning to FIG. 1, at step 106, the first set of parity sequences is processed to reflect the second set of charge constrained bit sequences. The following figure shows an example of this.

Figure 14:
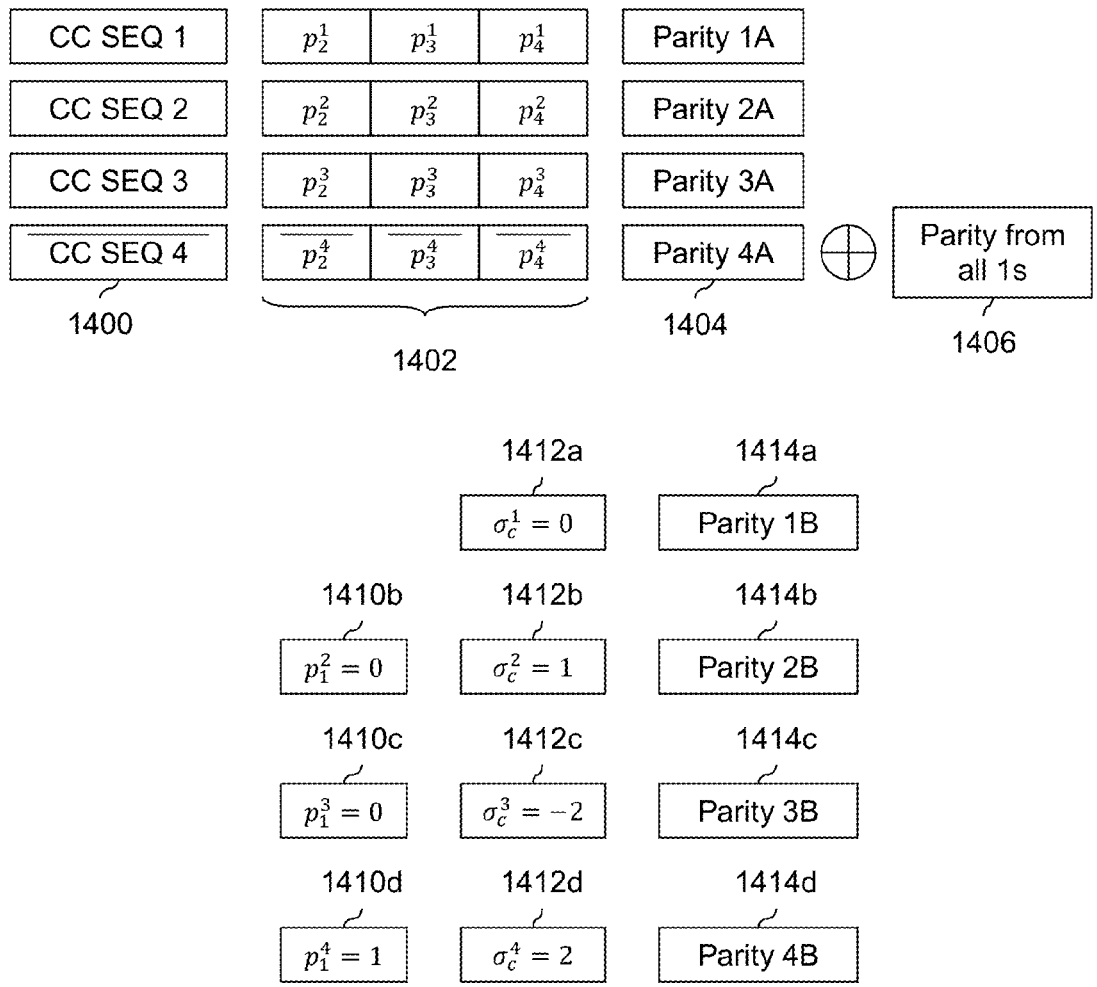
FIG. 14 is a diagram showing an embodiment of a second set of parity sequences.

FIG. 14 is a diagram showing an embodiment of a second set of parity sequences. In the example shown, fourth charge constrained bit sequence 1400 and corresponding polarity sequences 1402 have been bit flipped. To update parity sequence 1404 to reflect this bit flipping, parity sequence 1404 is exclusive ORed (i.e., XORed) with a parity generated from an all 1s bit sequence. Since the error correction code used to generate parity sequence 1404 is linear, XORing parity information 1404 with a parity sequence generated from an all 1s bit sequence (1406) is the same thing as if bit flipped data 1400 and 1402 were input to an error correction encoder in order to re-generate new parity information. In other words, EC Encode((All 1s)⊕x)=(EC Encode(All 1s)) ⊕(EC Encode(x)).

Since the other bit sequences were not flipped or changed, the other parity sequences are not XORed with a parity sequence generated from an all 1s bit sequence.

Updating or processing parity information in this manner may be attractive since Boolean and/or combinational logic (such as XOR logic) may consume less power than the error correction encoder, it is faster than the error correction encoder, and/or it keeps the error correction encoder free for other data.

In some embodiments, a second error correction code is used to protect RDS values 1412a-1412d. Parity sequence 1414a is generated from RDS value 1412a, parity sequence 1414b is generated from RDS value 1412b, parity sequence 1414c is generated from RDS value 1412c, and parity sequence 1414d is generated from RDS value 1412d. In this example, the second error correction code is (e.g., relatively speaking) stronger than a first error correction code associated with parity sequence 1404 and/or is very strong (e.g., when evaluated on an absolute scale). Using a very strong second error code may be acceptable in some applications, since the amount of parity information generated (i.e., 1414a-1414d) is relatively small. In some applications, RDS values are useful even if the user data is not decodable, but polarity bits are not useful when the user data is not decodable. As such, in some embodiments, RDS values are error correction encoded using a strong(er/est) code whereas polarity bits are not.

Note that error correction encoding and storage of RDS values 1412a-1412d is optional. For example, RDS values 1412a-1412d and the parities 1414a-1414d may not be stored at all.

Figure 15:
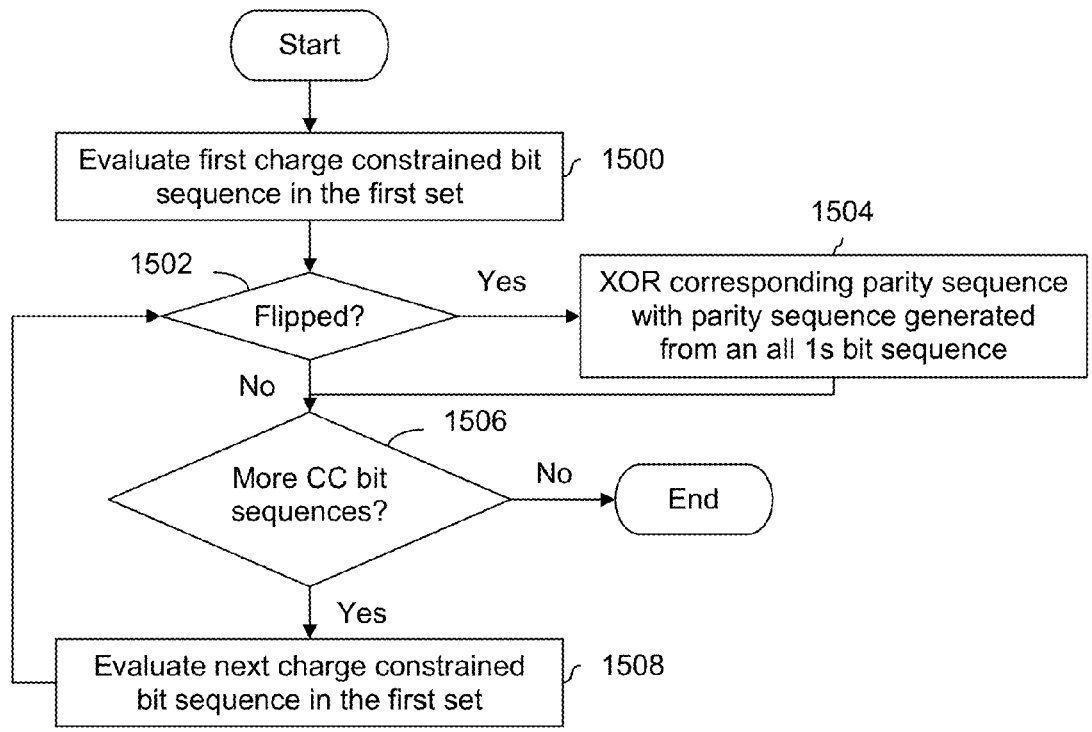
FIG. 15 is a flowchart illustrating an embodiment of a process for applying a charge constrained code to a first set of charge constrained bit sequences as a whole.

FIG. 15 is a flowchart illustrating an embodiment of a process for applying a charge constrained code to a first set of charge constrained bit sequences as a whole. In some embodiments, FIG. 15 is used at step 104 in FIG. 1. At 1500, a first charge constrained bit sequence in the first set is evaluated. It is determined at 1502 if it is flipped. If so, the corresponding parity sequence is XORed with a parity sequence generated from an all 1s bit sequence at 1504. See, for example, how parity sequence 1404 and the parity sequence from an all 1s bit sequence (1406) are XORed in FIG. 14. If it is not flipped at 1502 or after XORing at 1504, it is determined at 1506 if there are more charge constrained bit sequences. If so, a next charge constrained bit sequence in the first set is evaluated at 1508.

Figure 16:
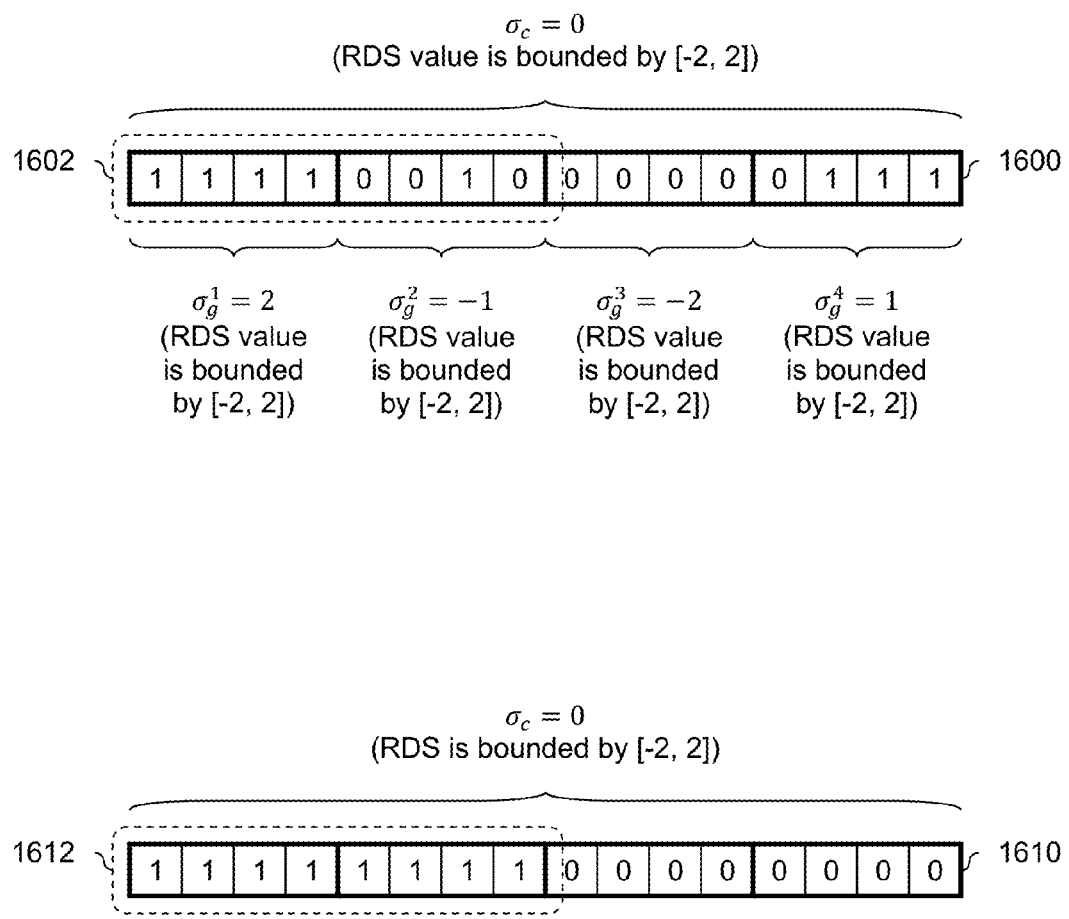
FIG. 16 is a diagram showing an embodiment of a charge constrained bit sequence from a second set and a charge constrained bit sequence generated using some other technique.

FIG. 16 is a diagram showing an embodiment of a charge constrained bit sequence from a second set and a charge constrained bit sequence generated using some other technique. In the example shown, charge constrained bit sequence 1600 is from a second set of the charge constrained bit sequences obtained according to the previous figures. For example, charge constrained bit sequence 1600 may be any one of charge constrained bit sequences 1200a-1200d in FIG. 12. In contrast, bit sequence 1610 is generated using some other technique.

As a whole, bit sequence 1600 has an RDS value of $\sigma_c=0$ where the RDS value is bounded by [−2, 2], and the first through fourth segments each have RDS values of $\sigma_g^1=2$, $\sigma_g^2=-1$, $\sigma_g^3=-2$, and $\sigma_g^4=1$ where each is guaranteed to be bounded by [−2, 2].

Bit sequence 1610 as a whole has an RDS of $\sigma_c=0$ where the RDS value is guaranteed to be bounded by [−2, 2], which is the same RDS value as bit sequence 1600. Unlike bit sequence 1600, however, segments of length M=4 within bit sequence 1610 are not guaranteed to meet or satisfy any RDS constraint limits. In this example, the first 8 bits have values of 1s and the last 8 bits have values of 0s.

In some cases, a storage system may access or obtain only a portion of a bit sequence. For example, suppose the storage system intakes only 8 bits at a time. In bit sequence 1600, portion 1602 would be read and in bit sequence 1610, portion 1612 would be read. A read processor which uses the read back values to adjust or determine a next read threshold for the solid state storage may expect approximately half of the bit values to be 0 and approximately half of the bit values to be 1. Since the first and second segments in portion 1602 are guaranteed to have RDS values which are bounded by [−2, 2], this expectation that roughly 50% of the values are 0s and roughly 50% of the values are 1s is fairly good for portion 1602 (e.g., portion 1602 can do no worse than 4 excess 1s or 4 excess 0s) and a read threshold generation or update technique will be able to generate a next or updated read threshold properly using portion 1602.

In contrast, portion 1612 contains all 1s and so even though the read threshold used to obtain portions 1612 may be at a good or desirable value, a read threshold generation technique which is expecting approximately 50% 1s and 0s may drastically adjust a next read threshold in an undesirable manner (e.g., it thinks 100% all 1's is wrong and drastically shifts the next read threshold). For this reason, the charge constraint encoding described in the previous figures may be more desirable than some other processing techniques (e.g., which generate bit sequence 1610).

Figure 17:
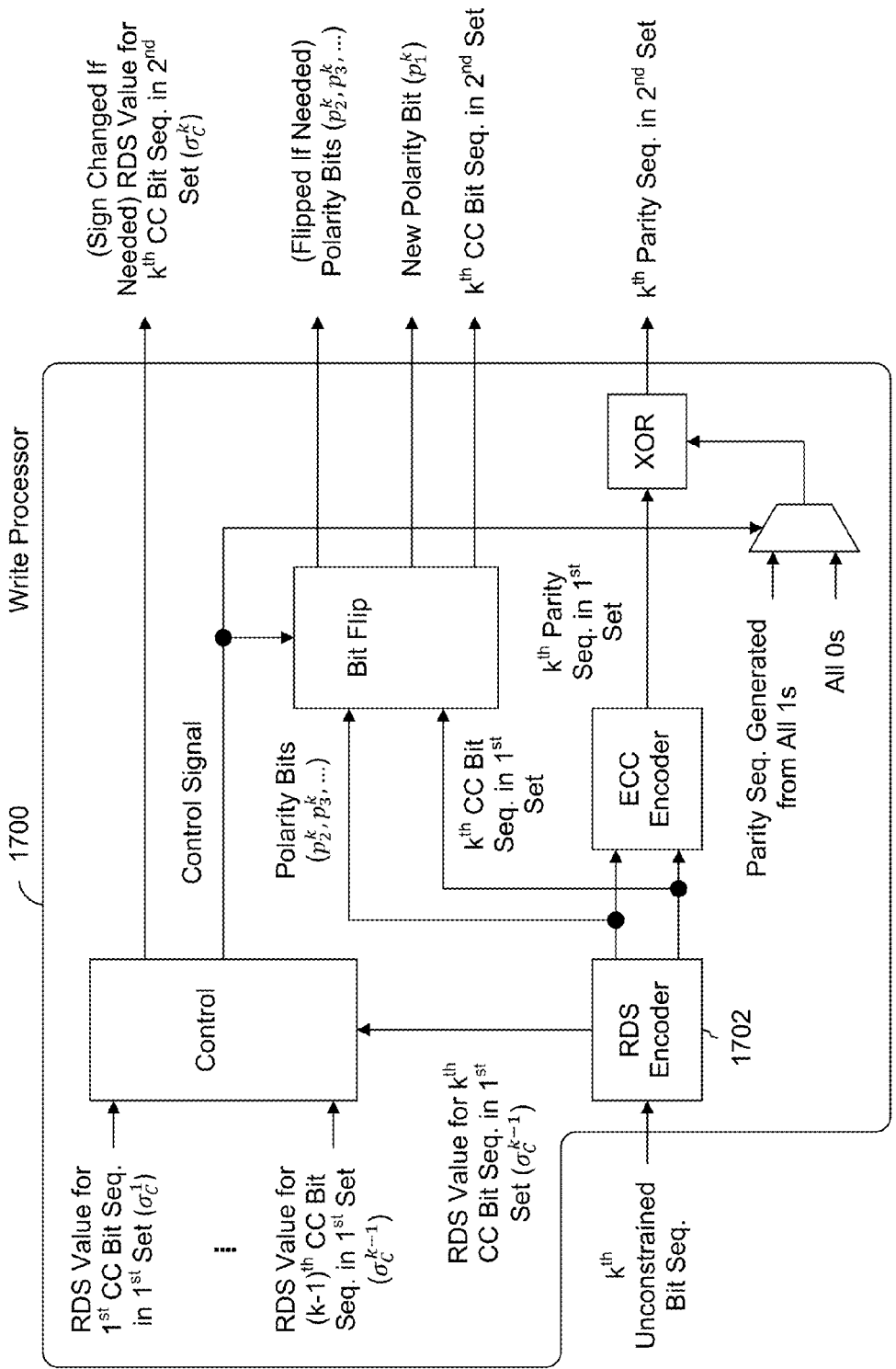
FIG. 17 is a diagram showing an embodiment of a write processor.

FIG. 17 is a diagram showing an embodiment of a write processor. In the example shown, write processor 1700, when operated iteratively, is configured to perform the process of FIG. 1. The $k^{th}$ iteration of write processor 1700 produces the two sets of charge constrained sequences, polarity bits, RDS values and parity bits corresponding to the $k^{th}$ unconstrained input sequence. In this example, parity information 1414a-1414d from FIG. 14 is neither generated nor saved by write processor 1700. Naturally, some other write processor embodiments may do so. In some embodiments, write processor 1700 includes or is implemented using a semiconductor device, such as an application-specific integrated circuit (ASIC) or a field-programmable gate array (FPGA).

Figure 18:
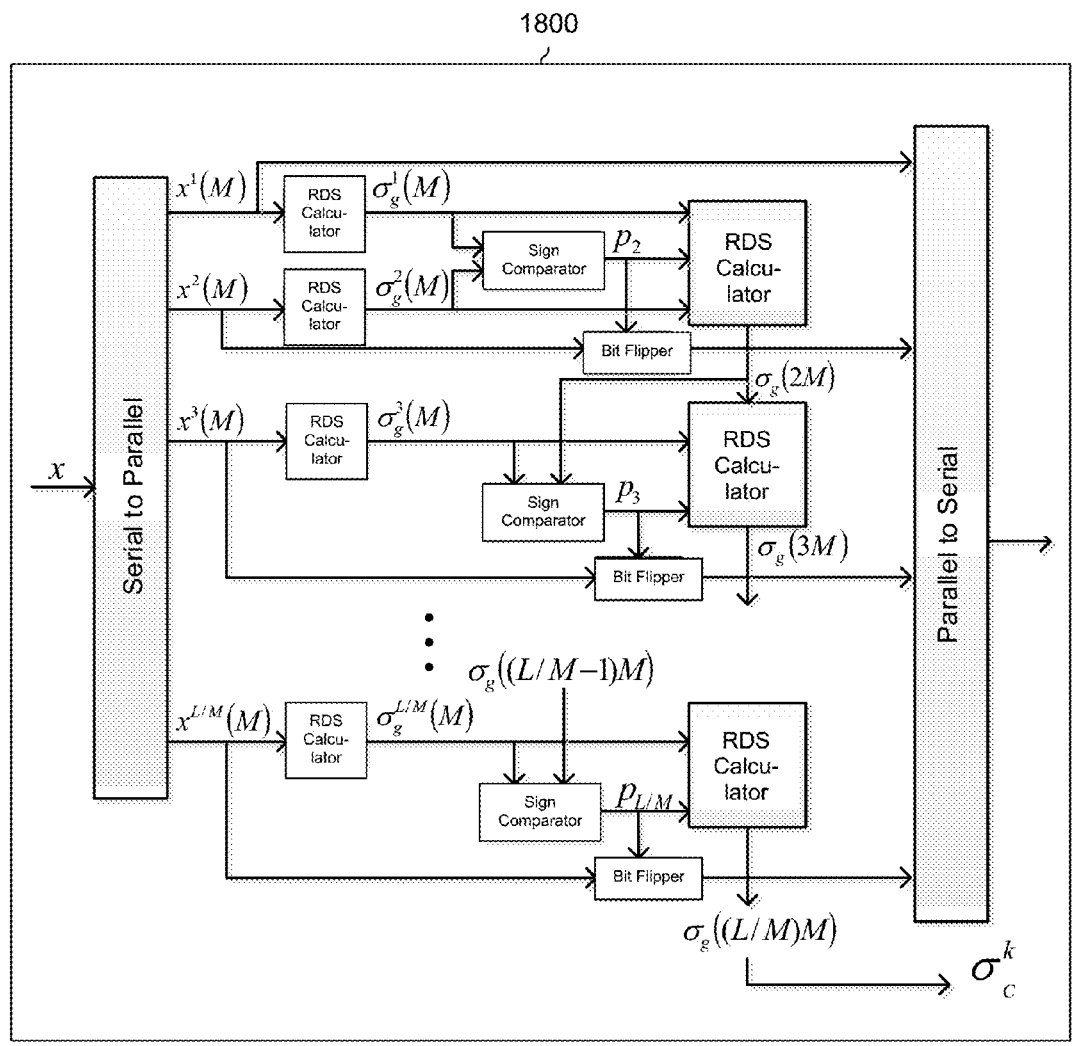
FIG. 18 is a diagram showing an embodiment of an RDS encoder which applies a charge constrained code to each unconstrained bit sequence in a set to obtain a first set of charge constrained bit sequences.

FIG. 18 is a diagram showing an embodiment of an RDS encoder which applies a charge constrained code to each unconstrained bit sequence in a set to obtain a first set of charge constrained bit sequences. In some embodiments, RDS encoder 1800 is used to implement RDS encoder 1702 in FIG. 17 and/or RDS encoder 1800 performs the process shown in FIG. 7. In some embodiments, the RDS values ($\sigma_c^k$) which are output are error correction encoded and/or saved (e.g., for use, if desired, by a read processor).

The following figures describe read-related techniques when a charge constrained code is used in a storage system. As described above, the read techniques described below do not necessarily need to be used with the write related techniques described above.

Figure 19:
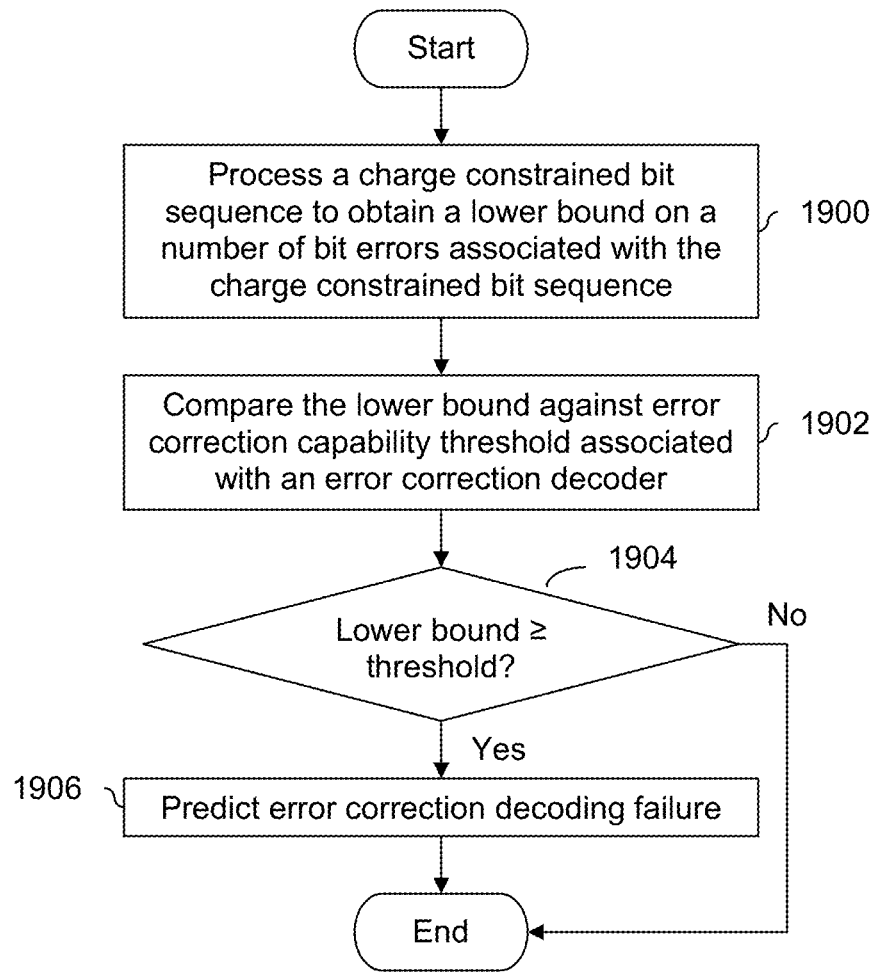
FIG. 19 is a flowchart illustrating an embodiment of a process for predicting an error correction decoder failure.

FIG. 19 is a flowchart illustrating an embodiment of a process for predicting an error correction decoder failure. In some embodiments, the process is performed by a read processor (e.g., implemented on a semiconductor device, such as an ASIC or FPGA) which reads backs a charge constrained bit sequence from storage and performs the example process on the read back data.

At 1900, a charge constrained bit sequence is processed to obtain a lower bound on a number of bit errors associated with the charge constrained bit sequence. The lower bound (B) is a minimum number of bit errors determined to exist in the bit sequence processed at 1900. In other words, it is determined that there are at least B bit errors in the processed bit sequence, possibly more. In some embodiments, step 1900 is performed by a Viterbi-like detector (e.g., a Viterbi detector which has been modified). Such as detector is referred to as a Viterbi-like detector since some processing traditionally performed by and/or data traditionally used by a Viterbi detector may not be of interest in this technique. For example, a traceback path between a starting state and an ending state is not necessarily of interest at 1900, so traceback related information may not necessarily be saved or kept. In some embodiments, step 1900 includes using an optimized or simplified process for determining a lower bound. An example of such a simplified process is described in further detail below.

At 1902, the lower bound is compared against an error correction capability threshold associated with an error correction decoder. For example, some error correction decoders may have a specified or known number of bit errors where if the input bit sequence contains more than that number of bit errors, the error correction decoder is guaranteed to fail. Even if an error correction decoder does not natively or intrinsically have such a threshold, one may be defined beyond which the error correction decoder is guaranteed to fail.

If at 1904 the lower bound is greater than or equal to the error correction capability threshold, then at 1906 an error correction decoding failure is predicted. In various embodiments, a read processor may respond in a variety of ways when an error correction decoding failure is predicted. For example, if a failure is predicted then the error correction decoder is not started (e.g., a future or pending decoding attempt is canceled) or it is terminated if it has already been started (e.g., in-progress decoding is interrupted). This helps save time and/or power wasted during unsuccessful decoding cycles. In some embodiments, it is possible to predict that a page is not decodable even if only a part of the page is transferred from the external storage (e.g., NAND Flash on a first semiconductor device) to a storage controller (e.g., on a second semiconductor device). The technique described herein improves the overall read latency and/or power by aborting a future or pending read transfer (e.g., of the remaining portion of the page which is not decodable) as soon as it detects that an error correction decoder will be unable to decode a particular page.

There are a number of benefits to using the process described above. First, power can be saved. In one example, the error correction decoder which is terminated early at 1906 is an iterative decoder, such as a low-density parity check (LDPC) decoder. In some systems, a low-density parity check (LDPC) decoder is permitted to run for a certain number of iterations before a decoding failure is declared. Typically, this maximum number of iterations is set to a relatively large number. If it is known that the decoder is guaranteed to fail, then terminating the error correction decoder early will save power; when the maximum number of iterations is set to a relatively large value (as it often is), the power savings may be significant.

Another benefit to using the process described above is that throughput may be improved. Typically there is only one error correction decoder in a read processor and if it takes a long time to process one piece of data, then subsequent data gets "backed up." Terminating an error decoder early permits subsequent data to be processed sooner and improves throughput.

The following figures show some examples of using a Viterbi-like detector at step 1900. First, permitted transitions in a trellis (associated with a Viterbi-like detector) are described for an exemplary charge constrained code. Naturally, different charge constrained codes will correspond to different trellises. Then, the entire trellis is shown with path metrics and branch metrics. After that, a simplified and/or optimized process for determining a lower bound is described.

Figure 20:
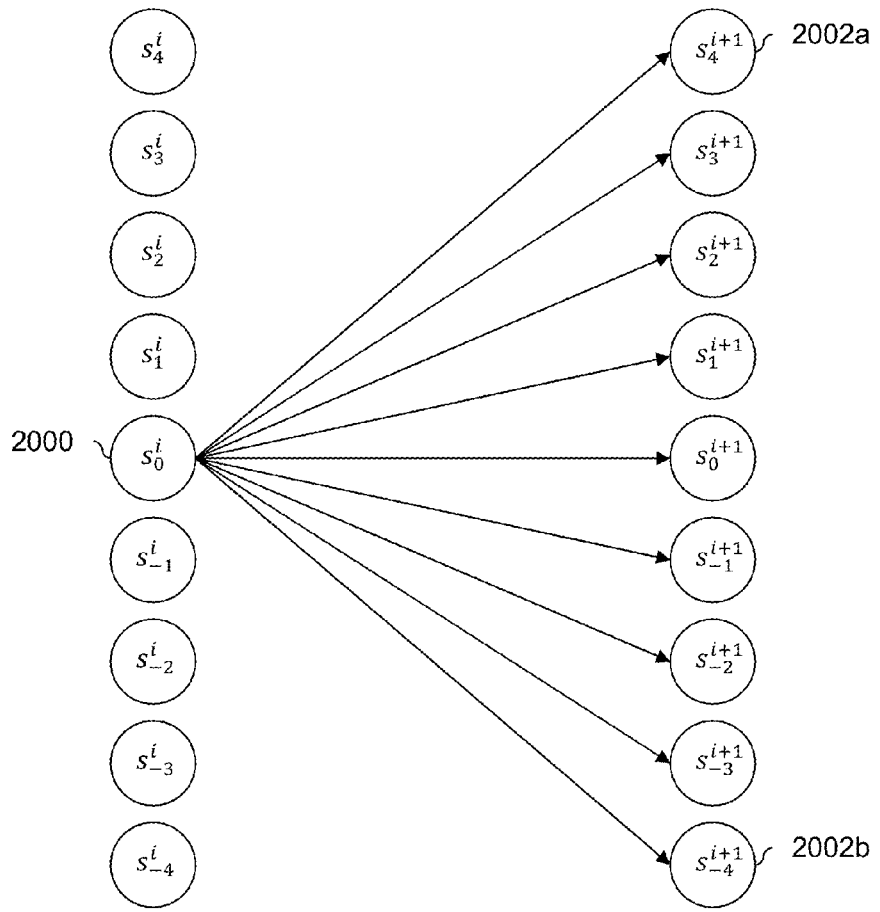
FIG. 20 is a diagram showing an embodiment of state transitions which are permitted out of a state associated with an RDS value of 0.
Figure 20:
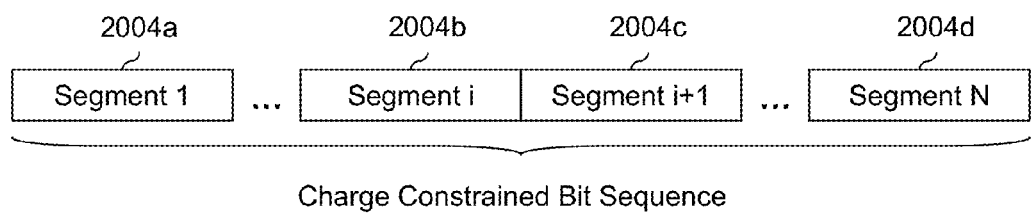

FIG. 20 is a diagram showing an embodiment of state transitions which are permitted out of a state associated with an RDS value of 0. In the example shown, an RDS constrained code is used where M=8 and thus the number of excess 1s is bounded by [−4, 4]. The RDS constrained code has been applied to the charge constrained bit sequence which includes segments 2004a-2004d. As such, each of segments 2004a-2004d has an RDS value which is bounded by [−4, 4] and the charge constrained bit sequence as a whole has an RDS value which is also bounded by [−4, 4].

In the example shown, the states on the left correspond to RDS values for segments up to and including segment i (2004b). The states on the right correspond to RDS values for segments up to and including segment i+1 (2004c). The subscript of a state indicates the RDS value of that state and the superscript indicates the last segment which has been processed. So, for example, state $s_{-4}^{i}$ corresponds to an RDS value of −4 after segment 1 (2004a) through segment i (2004b) have been processed.

From state $s_0^i$ (2000), the trellis is (in general) permitted to transition to all of states $s_4^{i+1}$ (2002a) through $s_{-4}^{i+1}$ (2002b). As used herein, a transition may also be referred to as a branch. Which transitions or branches are permitted (and correspondingly, which are not) is based on the RDS value up to and including segment i (i.e., $\sigma_g(iM)$), the possible RDS values for segment i+1 (which ranges from −4 to 4 in this example), and what the RDS constrained code encoding process described above would do given the previous two values. This is described in the following table. Note that in the leftmost column in the table below, $\sigma_g(iM)=0$ corresponds to state $s_0^i$ (2000) and the rightmost column in the table below corresponds to states on the right side of FIG. 20 (e.g., $\sigma_g((i+1)M)=4$ corresponds to state $s_4^{i+1}$ (2002a) and so on).

TABLE 1

Possible combinations for $\sigma_g(iM) = 0$ and M = 8.

| RDS value up to and including segment i (state on left side of Figure 20) | Possible RDS value for segment i + 1 | Combination permitted? | RDS value up to and including segment i + 1 (state on right side of Figure 20) |
| --- | --- | --- | --- |
| $\sigma_g(iM) = 0$ | $\sigma_g^{i+1}(M) = 4$ | Yes | $\sigma_g((i+1)M) = 4$ |
| $\sigma_g(iM) = 0$ | $\sigma_g^{i+1}(M) = 3$ | Yes | $\sigma_g((i+1)M) = 3$ |
| $\sigma_g(iM) = 0$ | $\sigma_g^{i+1}(M) = 2$ | Yes | $\sigma_g((i+1)M) = 2$ |
| $\sigma_g(iM) = 0$ | $\sigma_g^{i+1}(M) = 1$ | Yes | $\sigma_g((i+1)M) = 1$ |
| $\sigma_g(iM) = 0$ | $\sigma_g^{i+1}(M) = 0$ | Yes | $\sigma_g((i+1)M) = 0$ |
| $\sigma_g(iM) = 0$ | $\sigma_g^{i+1}(M) = -1$ | Yes | $\sigma_g((i+1)M) = -1$ |
| $\sigma_g(iM) = 0$ | $\sigma_g^{i+1}(M) = -2$ | Yes | $\sigma_g((i+1)M) = -2$ |
| $\sigma_g(iM) = 0$ | $\sigma_g^{i+1}(M) = -3$ | Yes | $\sigma_g((i+1)M) = -3$ |
| $\sigma_g(iM) = 0$ | $\sigma_g^{i+1}(M) = -4$ | Yes | $\sigma_g((i+1)M) = -4$ |

In the above table, since $\sigma_g(iM)=0$ for all of the rows in the above table, in FIG. 6, no flipping would occur at 608 since at 604 the RDS values for the segments processed so far (i.e., $\sigma_g(iM)$) is equal to 0 and the process goes to step 606 instead.

As such in FIG. 20, transitions from state $s_0^i$ (2000) to all of states $s_4^{i+1}$ (2002a) through $s_{-4}^{i+1}$ (2002b) are permitted.

Figure 21:
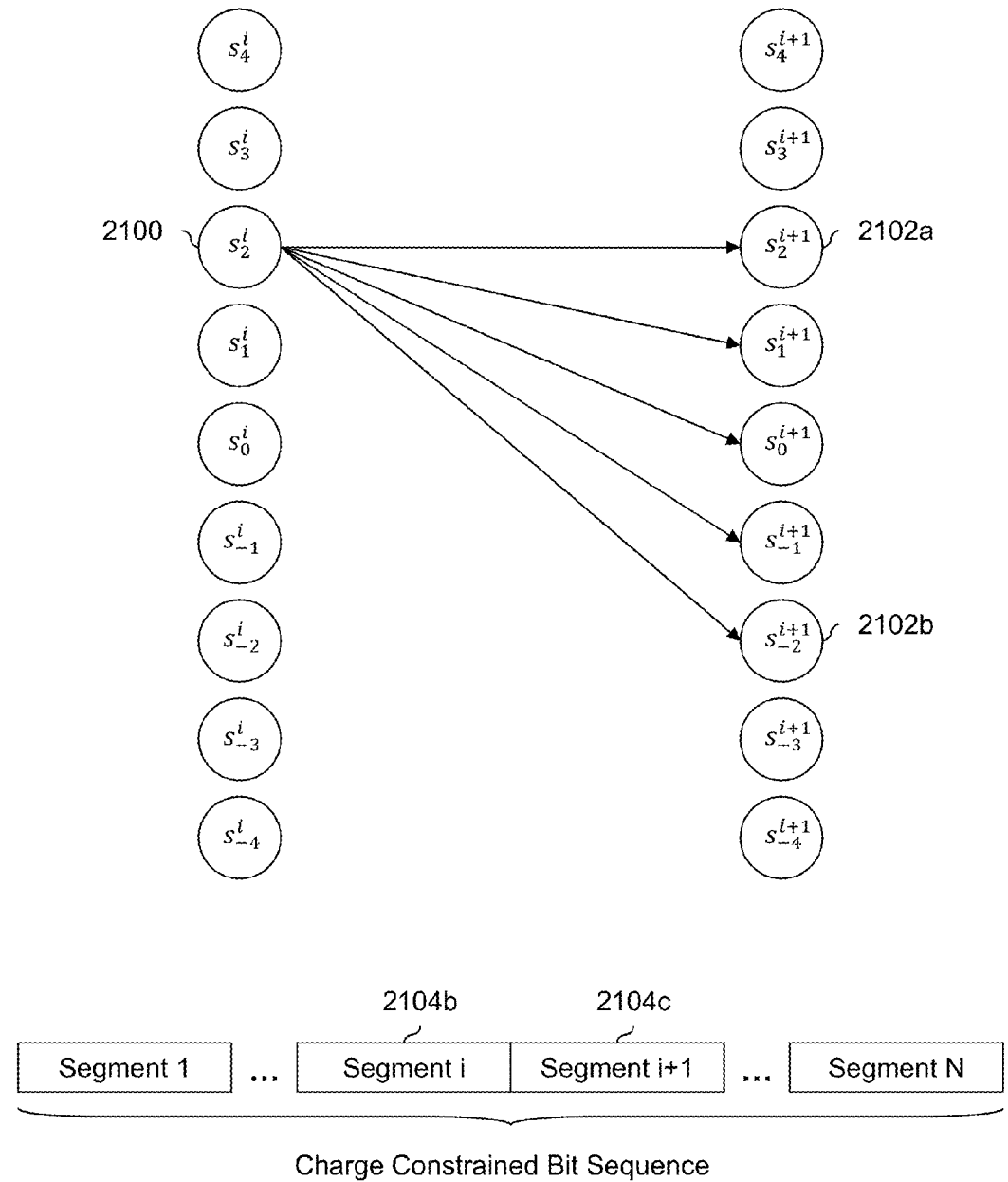
FIG. 21 is a diagram showing an embodiment of state transitions which are permitted out of a state associated with an RDS value of 2.

FIG. 21 is a diagram showing an embodiment of state transitions which are permitted out of a state associated with an RDS value of 2. In this example, the RDS value after processing all segments up and including segment i (2104b) is 2 and so the system is in state $s_2^i$ (2100). In this state, the permitted transitions are to state $s_2^{i+1}$ (2102a) through $s_{-2}^{i+1}$ (2102b). The following table shows all possible combinations of $\sigma_g(iM)$ (i.e., the RDS value up to and including segment i) when it is equal to 2 and all possible RDS values for segment i+1 ($\sigma_g^{i+1}(M)$). As before, in the leftmost column, $\sigma_g(iM)=2$ corresponds to state $s_2^i$ (2100) and the rightmost column corresponds to states on the right in FIG. 21 (e.g., $\sigma_g((i+1)M)=2$ corresponds to state $s_2^{i+1}$ (2102a)).

TABLE 2

Possible combinations for $\sigma_g(iM) = 2$ and M = 8.

| RDS value up to and including segment i | Possible RDS value for segment i + 1 | Combination permitted? | RDS value up to and including segment i + 1 |
| --- | --- | --- | --- |
| $\sigma_g(iM) = 2$ | $\sigma_g^{i+1}(M) = 4$ | No, because they have the same sign | N/A |
| $\sigma_g(iM) = 2$ | $\sigma_g^{i+1}(M) = 3$ | No, because they have the same sign | N/A |
| $\sigma_g(iM) = 2$ | $\sigma_g^{i+1}(M) = 2$ | No, because they have the same sign | N/A |
| $\sigma_g(iM) = 2$ | $\sigma_g^{i+1}(M) = 1$ | No, because they have the same sign | N/A |
| $\sigma_g(iM) = 2$ | $\sigma_g^{i+1}(M) = 0$ | Yes | $\sigma_g((i+1)M) = 2$ |
| $\sigma_g(iM) = 2$ | $\sigma_g^{i+1}(M) = -1$ | Yes | $\sigma_g((i+1)M) = 1$ |
| $\sigma_g(iM) = 2$ | $\sigma_g^{i+1}(M) = -2$ | Yes | $\sigma_g((i+1)M) = 0$ |
| $\sigma_g(iM) = 2$ | $\sigma_g^{i+1}(M) = -3$ | Yes | $\sigma_g((i+1)M) = -1$ |
| $\sigma_g(iM) = 2$ | $\sigma_g^{i+1}(M) = -4$ | Yes | $\sigma_g((i+1)M) = -2$ |

In the first 4 rows in the above table, $\sigma_g(iM)$ and $\sigma_g^{i+1}(M)$ are both positive and thus have the same sign. In FIG. 6, this would have caused the RDS constrained code encoder to go from decision 604 to step 608, which corresponds to flipping the bits in segment i+1 (2104c) and changing the sign of $\sigma_g^{i+1}(M)$ from positive to negative. As such, the combinations shown in the first 4 rows are not permitted by the RDS constrained code.

The other rows in the above table would (in FIG. 6) go from decision 604 to step 606 (e.g., because one of the RDS values is 0 or because the RDS values have different signs) and are thus permitted.

Figure 22:
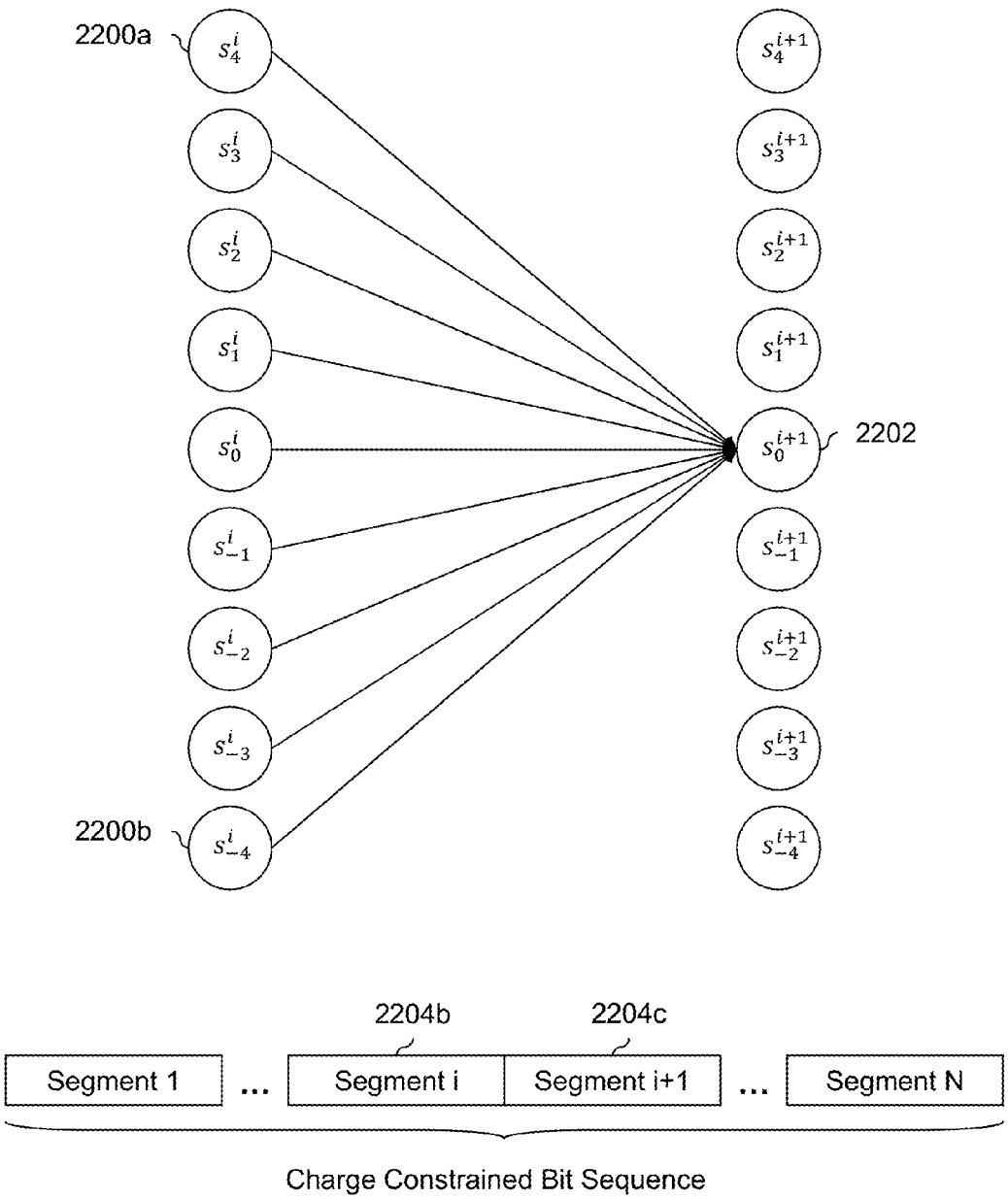
FIG. 22 is a diagram showing an embodiment of state transitions which are permitted into a state associated with an RDS value of 0.

FIG. 22 is a diagram showing an embodiment of state transitions which are permitted into a state associated with an RDS value of 0. In this example, permitted transitions into state $s_0^{i+1}$ (2202) are shown. The following table shows all possible combinations of RDS values up to and including segment i (2204b) (i.e., $\sigma_g(iM)$) and RDS values for segment i+1 (2204c) (i.e., $\sigma_g^{i+1}(M)$) which would result in $\sigma_g((i+1)M)=0$. In other words, the following table shows all possible combinations of values which range from −4 through 4 which sum to 0 (i.e., x+y=0 where x=−4, . . . , 4 and y=−4, . . . , 4).

TABLE 3

Possible combinations for $\sigma_g((i+1)M) = 0$ and $M = 8$.

| RDS value up to and including segment i | Possible RDS value for segment i + 1 | Combination permitted? | RDS value up to and including segment i + 1 |
|---|---|---|---|
| $\sigma_g(iM) = 4$ | $\sigma_g^{i+1}(M) = -4$ | Yes | $\sigma_g((i+1)M) = 0$ |
| $\sigma_g(iM) = 3$ | $\sigma_g^{i+1}(M) = -3$ | Yes | $\sigma_g((i+1)M) = 0$ |
| $\sigma_g(iM) = 2$ | $\sigma_g^{i+1}(M) = -2$ | Yes | $\sigma_g((i+1)M) = 0$ |
| $\sigma_g(iM) = 1$ | $\sigma_g^{i+1}(M) = -1$ | Yes | $\sigma_g((i+1)M) = 0$ |
| $\sigma_g(iM) = 0$ | $\sigma_g^{i+1}(M) = 0$ | Yes | $\sigma_g((i+1)M) = 0$ |
| $\sigma_g(iM) = -1$ | $\sigma_g^{i+1}(M) = 1$ | Yes | $\sigma_g((i+1)M) = 0$ |
| $\sigma_g(iM) = -2$ | $\sigma_g^{i+1}(M) = 2$ | Yes | $\sigma_g((i+1)M) = 0$ |
| $\sigma_g(iM) = -3$ | $\sigma_g^{i+1}(M) = 3$ | Yes | $\sigma_g((i+1)M) = 0$ |
| $\sigma_g(iM) = -4$ | $\sigma_g^{i+1}(M) = 4$ | Yes | $\sigma_g((i+1)M) = 0$ |

In all of the rows shown above, the signs of $\sigma_g(iM)$ and $\sigma_g^{i+1}(M)$ are opposite signs, so all combinations are permitted; this corresponds to permitted transitions from state $s_4^i$ (2200a) through $s_{-4}^i$ (2200b) into state $s_0^{i+1}$ (2202).

Figure 23:
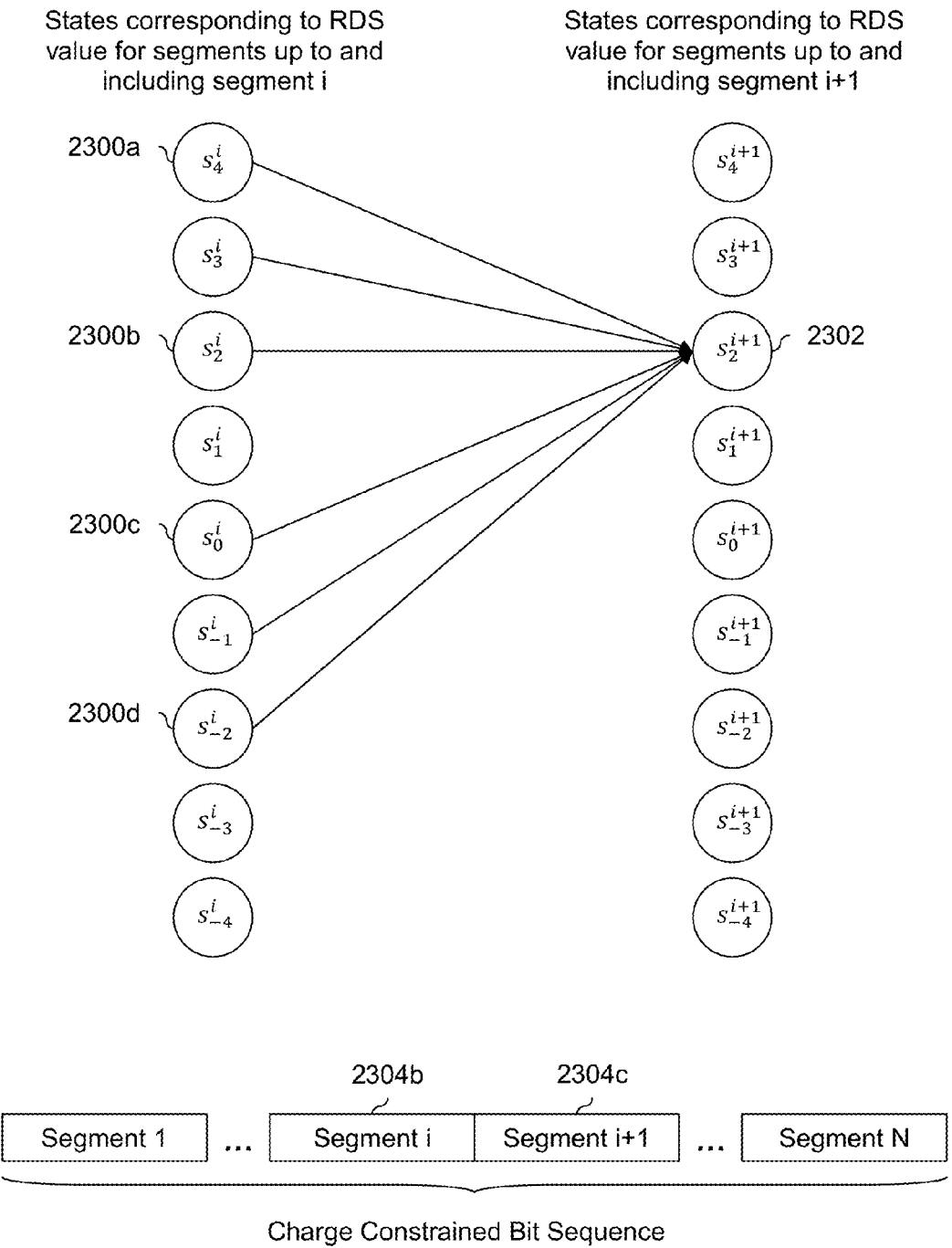
FIG. 23 is a diagram showing an embodiment of state transitions which are permitted into a state associated with an RDS value of 2.

FIG. 23 is a diagram showing an embodiment of state transitions which are permitted into a state associated with an RDS value of 2. In this example, permitted transitions into state $s_2^{i+1}$ (2302) are shown. The following table shows all possible combinations of RDS values up to and including segment i (2304b) (i.e., $\sigma_g(iM)$) and RDS values for segment i+1 (2304c) (i.e., $\sigma_g^{i+1}(M)$) which would result in $\sigma_g((i+1)M)=2$. In other words, the following table shows all possible combinations of values which range from -4 through 4 which sum to 2 are shown (i.e., x+y=2 where x=-4, . . . , 4 and y=-4, . . . , 4).

TABLE 4

Possible combinations for $\sigma_g((i+1)M) = 2$ and $M = 8$.

| RDS value up to and including segment i | Possible RDS value for segment i + 1 | Combination permitted? | RDS value up to and including segment i + 1 |
|---|---|---|---|
| $\sigma_g(iM) = 4$ | $\sigma_g^{i+1}(M) = -2$ | Yes | $\sigma_g((i+1)M) = 2$ |
| $\sigma_g(iM) = 3$ | $\sigma_g^{i+1}(M) = -1$ | Yes | $\sigma_g((i+1)M) = 2$ |
| $\sigma_g(iM) = 2$ | $\sigma_g^{i+1}(M) = 0$ | Yes | $\sigma_g((i+1)M) = 2$ |
| $\sigma_g(iM) = 1$ | $\sigma_g^{i+1}(M) = 1$ | No, because they have the same sign | $\sigma_g((i+1)M) = 2$ |
| $\sigma_g(iM) = 0$ | $\sigma_g^{i+1}(M) = 2$ | Yes | $\sigma_g((i+1)M) = 2$ |
| $\sigma_g(iM) = -1$ | $\sigma_g^{i+1}(M) = 3$ | Yes | $\sigma_g((i+1)M) = 2$ |
| $\sigma_g(iM) = -2$ | $\sigma_g^{i+1}(M) = 4$ | Yes | $\sigma_g((i+1)M) = 2$ |

In the $4^{th}$ row where $\sigma_g(iM)=1$ and $\sigma_g^{i+1}(M)=1$, the two RDS values have the same sign and thus would not be permitted. As a result, state $s_4^i$ (2300a) through state $s_2^i$ (2300b) and state $s_0^i$ (2300c) through state $s_{-2}^i$ (2300d) are permitted to transition into state $s_2^{i+1}$ (2302).

An entire trellis may be constructed by performing some combination of the above evaluations (i.e., what transitions are permitted from a given state and/or what transitions are permitted into a given state).

The following figures show an example of a bit sequence processed to obtain a lower bound of an error. In some embodiments, a trellis constructed using one or more of the above techniques is used to process the bit sequence.

Figure 24:
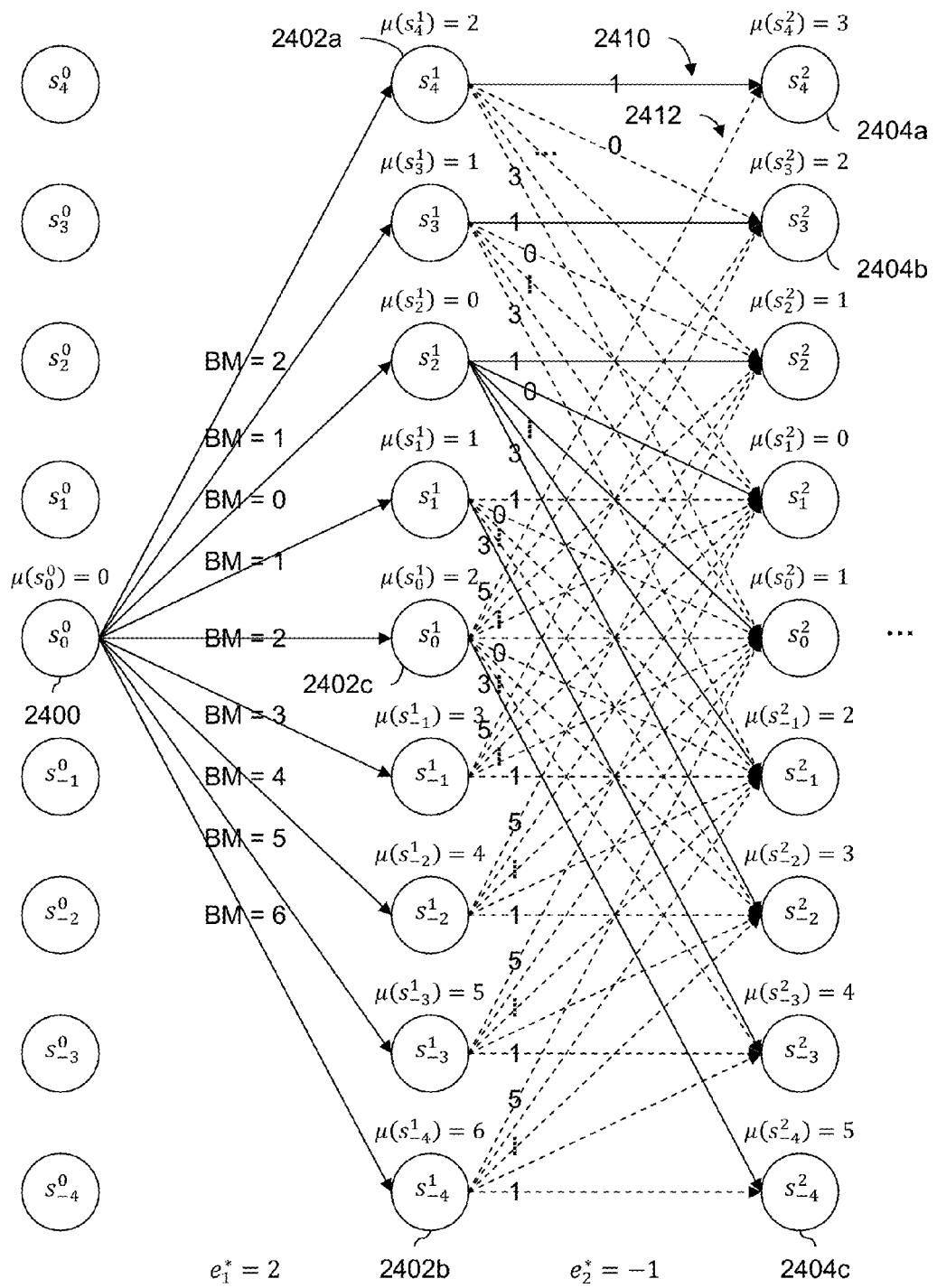
FIG. 24 is a diagram showing an embodiment of metrics calculated for the first two segments in a bit sequence.

FIG. 24 is a diagram showing an embodiment of metrics calculated for the first two segments in a bit sequence. In this example, N=7 (i.e., there are 7 segments) and $e_t^*$ (i.e., the number of excess 1s from the read back bit sequence) is $e_t^*=[2, -1, -4, 2, -2, -4, 1]$. As shown in FIG. 24, for the first segment, the number excess 1s observed is $e_1^*=2$ and for the second segment, the number of excess 1s observed is $e_2^*=-1$.

At the beginning of processing, the system begins in state $s_0^0$ (2400). Conceptually, no segments have been processed yet, so the RDS value for segments processed so far (in this case, none) is 0. This corresponds to a starting state of $s_0^0$ (2400).

As described above, from state $s_0^0$ (2400), transitions to all of states $s_4^1$ (2402a) through $s_{-4}^1$ (2402b) are permitted. For each of those transitions, a branch metric is calculated. In this example, a branch metric represents a difference between an observed number of excess 1s (e.g., based on the bit sequence read back from storage) and an expected number of excess 1s (e.g., based on the starting state and the ending state for a given transition or branch).

For example, for the transition from state $s_0^0$ (2400) to state $s_4^1$ (2402a), the observed number of excess 1s is 2 since $e_1^*=2$. The expected number of excess 1s for that transition depends upon the number of excess 1s in the source state (in this case, state $s_0^0$ (2400) which corresponds to 0 excess 1s) and the number of excess 1s in the destination state (in this case, state $s_4^1$ (2402a) which corresponds to 4 excess 1s). In this example, the transition $s_0^0 \rightarrow s_4^1$ corresponds to 4 excess 1s so the expected number of excess 1s for this transition is 4. The branch metric is the absolute value of the difference between the expected number of excess 1s and the observed number of excess 1s (or vice versa). As such, the branch metric for that transition is $|4-2|=2$ (or, alternatively, $|2-4|=2$).

Similarly, for the transition from state $s_0^0$ (2400) to state $s_{-4}^1$ (2402b), the observed number of excess 1s is $e_1^*=2$ (this is the same for all transitions associated with the first segment). The expected number of excess 1s for the transition from state $s_0^0$ (2400) to state $s_{-4}^1$ (2402b) is -4. The branch metric for the transition from state $s_0^0$ (2400) to state $s_{-4}^1$ (2402b) is $|2-(-4)|=6$ (or, alternatively, $|(-4)-2|=6$).

The above process may be repeated to generate branch metrics for all of the transitions from state $s_0^0$ (2400) to state $s_4^1$ (2402a) through state $s_{-4}^1$ (2402b). Naturally, the branch metric calculation technique described herein is merely exemplary and is not intended to be limiting.

Branch metrics are similarly calculated for all of the possible transitions associated with the second segment (e.g., based at least in part on the observed number of excess 1s (i.e., $e_2^*=-1$) and the expected number of excess 1s) and are shown in the figure. For brevity, this is not described in detail.

Unlike the transitions associated with the first segment, there are multiple possible transitions associated with the second segment going into a given destination state. For example, for the first segment, the only possible transitions going into any given destination state are from state $s_0^0$ (2400). Put another way, there is only one arrow going into state $s_4^1$ (2402a), there is only one arrow going into state $s_{-4}^1$ (2402b), and so on. In contrast, state $s_4^2$ (2404a) has two arrows going into it, state $s_3^2$ (2404b) has 4 arrows going into it, and so on.

For each destination state, the Viterbi-like detector selects the transition which gives the best path from the start of the trellis (i.e., state $s_0^0$ (2400)) up to and including the given destination state. For example, for state $s_4^2$ (2404a), the Viterbi-like detector selections either transition 2410 or transition 2412 based on which one has the best path from state $s_0^0$ (2400) to state $s_4^2$ (2404a). To make this calculation easier, a path metric ($\mu$) is used. The path metric $\mu$(state) gives the sum of branch metrics for the best path from the starting state of the trellis to that particular state. For example, for the starting state $s_0^0$ (2400), the path metric is $\mu(s_0^0)=0$. For the states $s_4^1$ ($2402a$) through $s_{-4}^1$ ($2402b$), the path metric is the sum of the branch metric plus $\mu(s_0^0)$. For example, the path metric for state $s_4^1$ ($2402a$) is $\mu(s_4^1)=2$.

For state $s_4^2$ ($2404a$), the possible paths in are from state $s_4^1$ ($2402a$) or from state $s_0^1$ ($2402c$). The path metric for the former corresponds to $\mu(s_4^1)$ plus the branch metric for transition 2410, or $2+1=3$. The path metric for the latter corresponds to $\mu(s_0^1)$ plus the branch metric for transition 2412, or $2+5=7$. Since the former has the better path metric, transition 2410 is selected to be part of the surviving path and transition 2412 is discarded. In this example, the optimal solution permits unselected transitions to be discarded (i.e., there is no performance loss by discarding transition 2412 and/or other unselected transitions into a given state). Some other techniques, in contrast, require multiple transitions into a given state to be saved, which requires more memory and makes those other techniques less attractive.

Using the technique described above, for each of states $s_4^2$ ($2404a$) through $s_{-4}^2$ ($2404c$), a single transition into each of the states is selected. Path metrics associated with the surviving path from the start of the trellis (i.e., state $s_0^0$ (2400)) into each of states $s_4^2$ ($2404a$) through $s_{-4}^2$ ($2404c$) are shown above each state.

Figure 25:
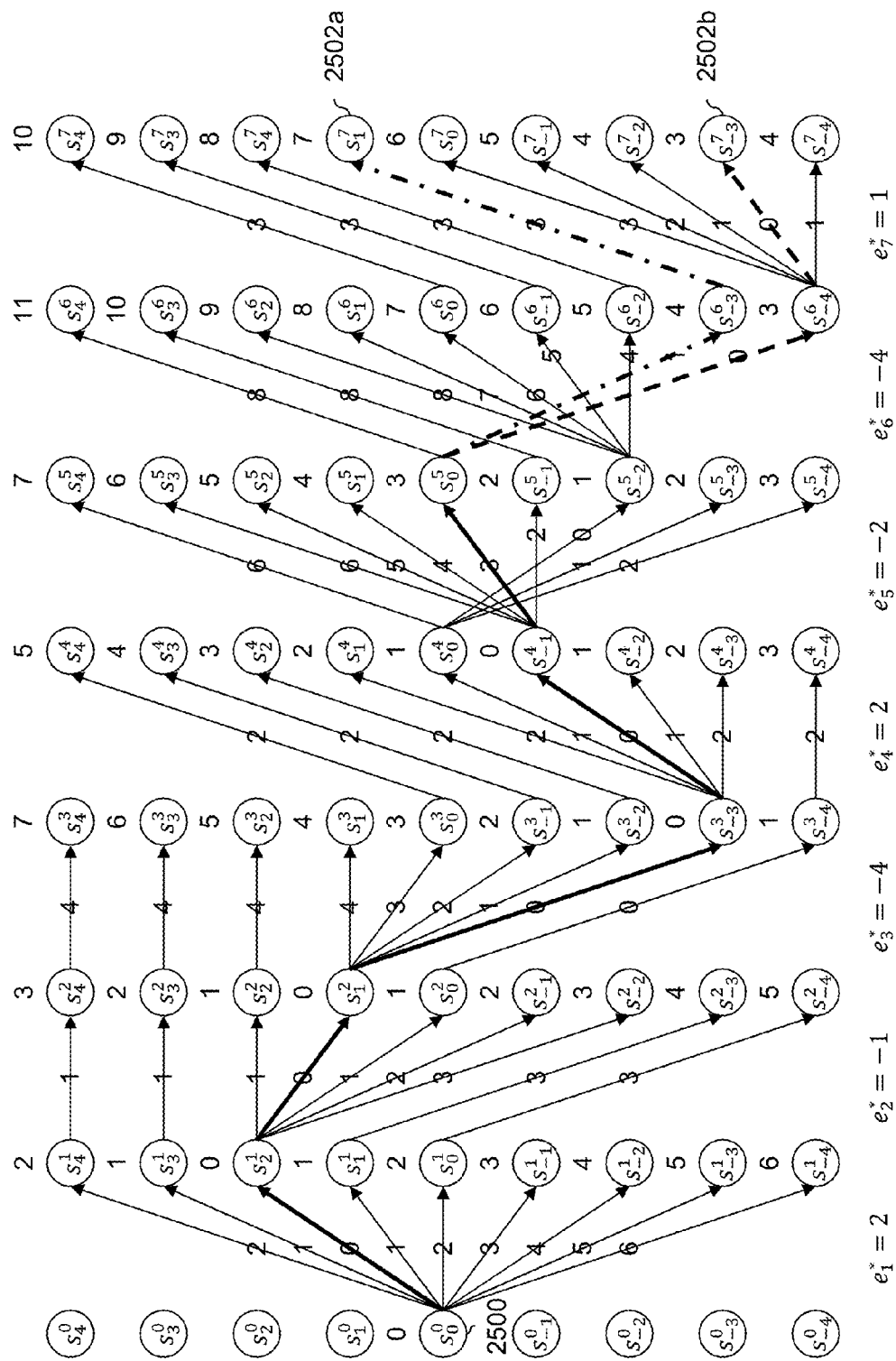
FIG. 25 is a diagram showing an embodiment of branch metrics, path metrics, and surviving paths for a trellis.

FIG. 25 is a diagram showing an embodiment of branch metrics, path metrics, and surviving paths for a trellis. FIG. 25 continues the example of FIG. 24 and unselected, discarded state transitions are not shown. In this example, path metrics are shown above each state and branch metrics are shown over the corresponding transition. Observed numbers of excess 1s for each segment (e.g., obtained from the read back, charge constrained bit sequence) are shown at the bottom of the figure.

The example trellis shown herein will be used to describe how a lower bound of an error is calculated for two scenarios. In the first scenario, the RDS value for the charge constrained bit sequence is not saved by the write processor. For example, in FIG. 14, this corresponds to not storing RDS values $1412a$-$1412d$. In the second scenario, the RDS value for the charge constrained bit sequence is saved and is thus available for use by the Viterbi-like detector.

When an RDS value for a bit sequence is not stored, the lowest path metric in the last stage is selected. In this example, state $s_{-3}^7$ ($2502b$) has a path metric of $\mu(s_{-3}^7)=3$, which is the lowest value in the last stage. The lower bound of the error is the path metric for that state. In other words, the lower bound of the error (B) in that scenario is 3, which means that there are at least 3 bit errors in the bit sequence.

Note that this technique uses a Viterbi-like detector to obtain a lower bound of an error and so a path between starting state $s_0^0$ (2500) and selected ending state $s_{-3}^7$ ($2502b$) is not necessarily of interest here, and information which is saved and used in other Viterbi-like detectors to perform a traceback may not necessarily be saved herein. Although the path between starting state $s_0^0$ (2500) and selected ending state $s_{-3}^7$ ($2502b$) is shown with a darkened line and a darkened, dashed line, this path is not necessarily of interest in this technique.

When an RDS value for a bit sequence is available, the state corresponding to the saved RDS value is selected and the path metric of the selected state is the lower bound of the error. For example, suppose the saved RDS value for the example bit sequence is 1. For that saved RDS value, state $s_1^7$ ($2502a$) is selected. The path metric for that state is $\mu(s_1^7)=7$ so the lower bound of the error (B) in that case is 7.

It is possible to transform the Viterbi decoding process described in FIG. 25 into a more simplified one which is designed to generate a lower bound on a number of bit errors. One observation which enables this simplification is that the path metric of any state $s_j^t$ is given by $\mu(s_j^t)=a_t+|j-b_t|$ where j is the number of excess 1s associated with state $s_j^t$, t is the stage associated with state $s_j^t$ (alternatively, another way of describing t is the number of segments which have been processed so far), $b_t$ is the number of excess 1s associated with the state which has the lowest path metric after t segments have been processed, and $a_t$ is an offset to a valid trellis path (e.g., the minimum number of bit flips required to transform a received charge constrained bit sequence into a valid trellis path).

Another observation which may be used to simplify the Viterbi decoding process described in FIG. 25 is that unlike most other applications involving a Viterbi detector, a final or survivor path from a beginning stage to an ending stage (e.g., determined during traceback) is not of interest in this application. The objective of this application of Viterbi-like processing is to determine a lower bound for a number of bit errors in a received charge constrained bit sequence; this application is not so much interested in which bits in the received bit sequence should be flipped because they are wrong. If traceback is required, then all path metrics $\mu(s_j^t)$ for all possible counts of excess 1s (i.e., j) and all possible stages (i.e., t) must be saved for traceback. In contrast, in light of the observation that traceback is not of interest for this application, once the path metrics $\mu(s_j^t)$ for all j for a given t is calculated, the path metrics $\mu(s_j^{t-1})$ for all j for the previous stage may be discarded. This may be implemented by performing in-place operations, which overwrite the previous path metrics (e.g., contained in memory) with the new path metrics.

Figure 26:
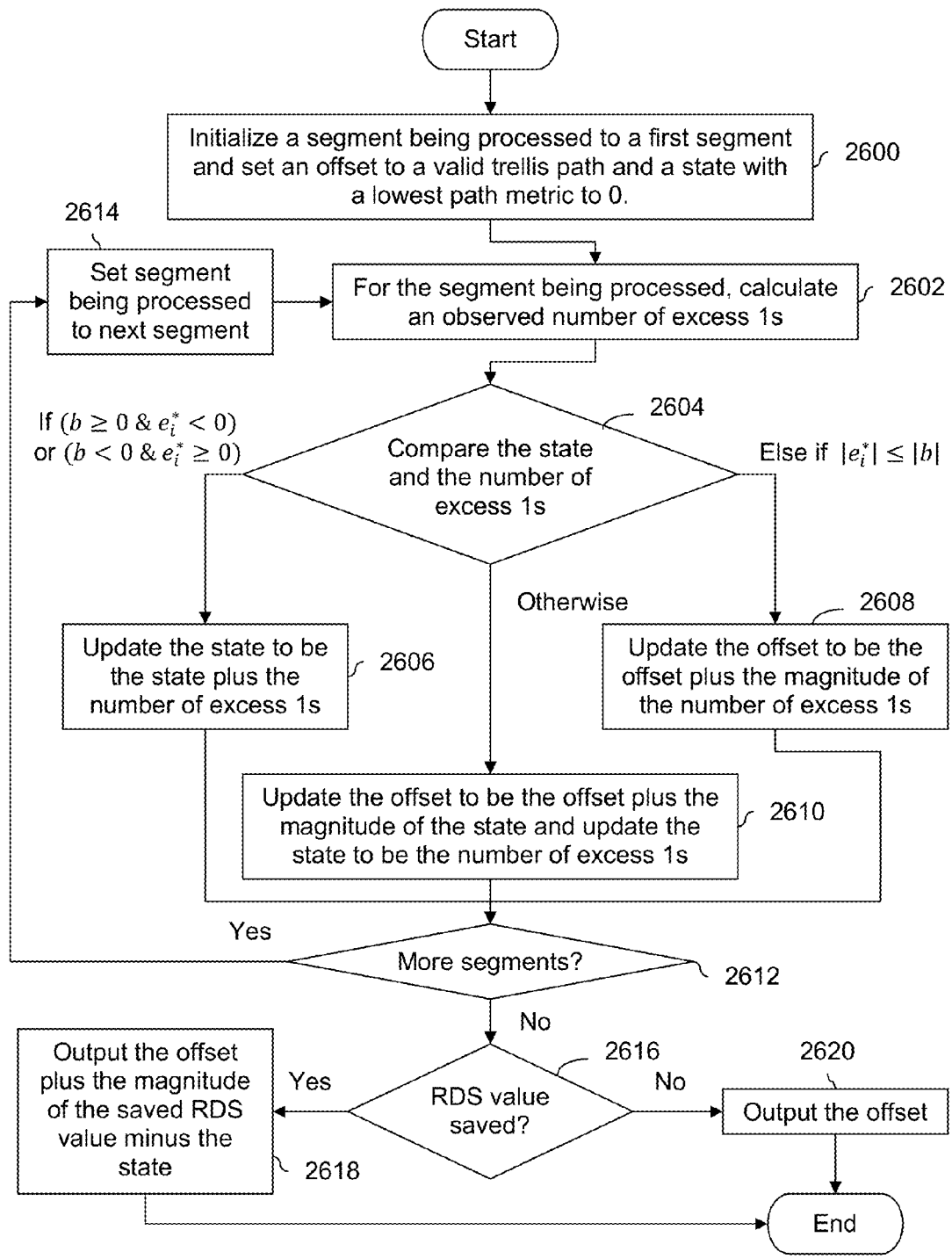
FIG. 26 is a diagram showing an embodiment of a process for determining a lower bound for the number of bit errors.

FIG. 26 is a diagram showing an embodiment of a process for determining a lower bound for the number of bit errors. In some embodiments, the process is performed in parallel to error correction decoding and the output lower bound is used to determine whether or not to terminate the error correction decoding early. In other words, in some embodiments, the process shown herein is used at step 1900 in FIG. 19.

At 2600, a segment being processed is initialized to the first segment and an offset to a valid trellis path and a state with the lowest path metric are set to 0. For brevity and convenience, i is the segment number being processed, a is the offset to a valid trellis path, and b is the state with the lowest path metric. At step 2600, i is set to 1 and a and b are set to 0.

At 2602, for the segment being processed, an observed number of excess 1s is calculated. Also for brevity and convenience, $e_i^*$ is the observed number of excess 1s for segment i (e.g., without taking into consideration segment (i−1) or any other segments). In FIG. 25, for example, $e_1^*=2$, $e_2^*=-1$, and so on. To formally express calculation of the observed number of excess 1s:

$$e_i^* = \left(\sum_{r=1}^M \hat{y}_{(i-1)M+r}\right) - \frac{M}{2}$$

At 2604, the state and the number of excess 1s are compared. If the state is greater than or equal to 0 and the observed number of excess 1s is strictly less than 0, or the state is strictly less than 0 and the observed number of excess 1s is greater than or equal to 0 (i.e., (b≥0 and $e_i^*<0$) or (b<0 and $e_i^*\geq0$)), then at 2606 the state is updated to be the state plus the number of excess 1s. In other words, b←b+$e_i^*$.

Else if the magnitude of the observed number of excess 1s is less than or equal to the magnitude of the state (i.e., $|e_i^*| \leq |b|$), then at 2608 the offset is updated to be the offset plus the magnitude of the number of excess 1s. In other words, $a \leftarrow a+|e_i^*|$.

Otherwise, at 2610, the offset is updated to be the offset plus the magnitude of the state and the state is updated to be the number of excess 1s (i.e., $a \leftarrow a+|b|$ and $b \leftarrow e_i^*$). Note that because at step 2608 and 2610 magnitudes are being added in the update of the offset, the offset (i.e., a) can only increase and cannot decrease.

After step 2606, 2608, or 2610, it is determined at 2612 if there are more segments. If so, the segment being processed is set to the next segment at 2614. If not, it is determined at 2616 if an RDS value was saved. If so, at 2618, the offset plus the magnitude of the saved RDS value minus the state is output (i.e., $B=a_N+|\sigma_C-b_N|$ where $\sigma_C$ is the saved RDS value). If not, at 2620, the offset is output (i.e., $B=a_N$).

The following table shows the example process applied to the charge constrained bit sequence associated with FIG. 25.

TABLE 5

Example values calculated during determination of a lower bound on a number of bit errors.

| Segment Number | Observed number of excess 1s for that segment | Offset to a valid trellis path up to and including that segment | State with the lowest path metric up to and including that segment |
|---|---|---|---|
| Segment 1 | $e_1^* = 2$ | $a_1 = 0$ | $b_1 = 2$ |
| Segment 2 | $e_2^* = -1$ | $a_2 = 0$ | $b_2 = 1$ |
| Segment 3 | $e_3^* = -4$ | $a_3 = 0$ | $b_3 = -3$ |
| Segment 4 | $e_4^* = 2$ | $a_4 = 0$ | $b_4 = -1$ |
| Segment 5 | $e_5^* = -2$ | $a_5 = 1$ | $b_5 = -2$ |
| Segment 6 | $e_6^* = -4$ | $a_6 = 3$ | $b_6 = -4$ |
| Segment 7 | $e7^* = 1$ | $a_7 = 3$ | $b_7 = -3$ |

Using the $a_7$ and $b_7$ values from the table above, results which are consistent with those shown in FIG. 25 can be obtained using the process of FIG. 26. If there is no RDS value saved, then at 2620 the lower bound which is output is $B=a_7+|\sigma_C-b_7|=3+|1-(-3)|=7$. This is the same result as described above in association with FIG. 25. If there is an RDS value that is saved, then at 2620 the lower bound, which is output, is $B=a_7=3$. Again, this is the same result which was described above in association with FIG. 25.

In the above table, note that the offsets (i.e., a) in the above table are consistent with the lowest state metric (i.e., μ) in each column/stage in FIG. 25 and the states with the lowest path metric (tracked using b) correspond to the states with the lowest state metric in each column in FIG. 25. For example, $b_1=2$ corresponds to $s_2^1$ and $a_1=0$ corresponds to $\mu(s_2^1)=0$, $b_2=1$ corresponds to $s_1^2$ and $a_2=0$ corresponds to $\mu(s_1^2)=0$, and so on.

The simplified process described in FIG. 26 enables fewer registers to be used, which is attractive because the device is smaller and less power is consumed. For example, suppose a segment size of M=256 is used. Since for M=256 a trellis will have M+1 different states (i.e., there are 257 rows in the trellis), a naïve implementation will employ 257 registers, one for each state. Each of those registers has a size of $[\log_2 n]$ bits since what is tracked is the number of bit errors in a page and there are n bits in a page. With the simplified process in FIG. 26, only two registers are used where one of the registers has a size of $\log_2 M$ bits (which for M=256 is 8 bits) and the other register has a size of $[\log_2 n]$ bits (which for n=16384 bits per page is 14 bits). Compared to 257 registers of 14 bits each, this is an improvement.

Figure 27:
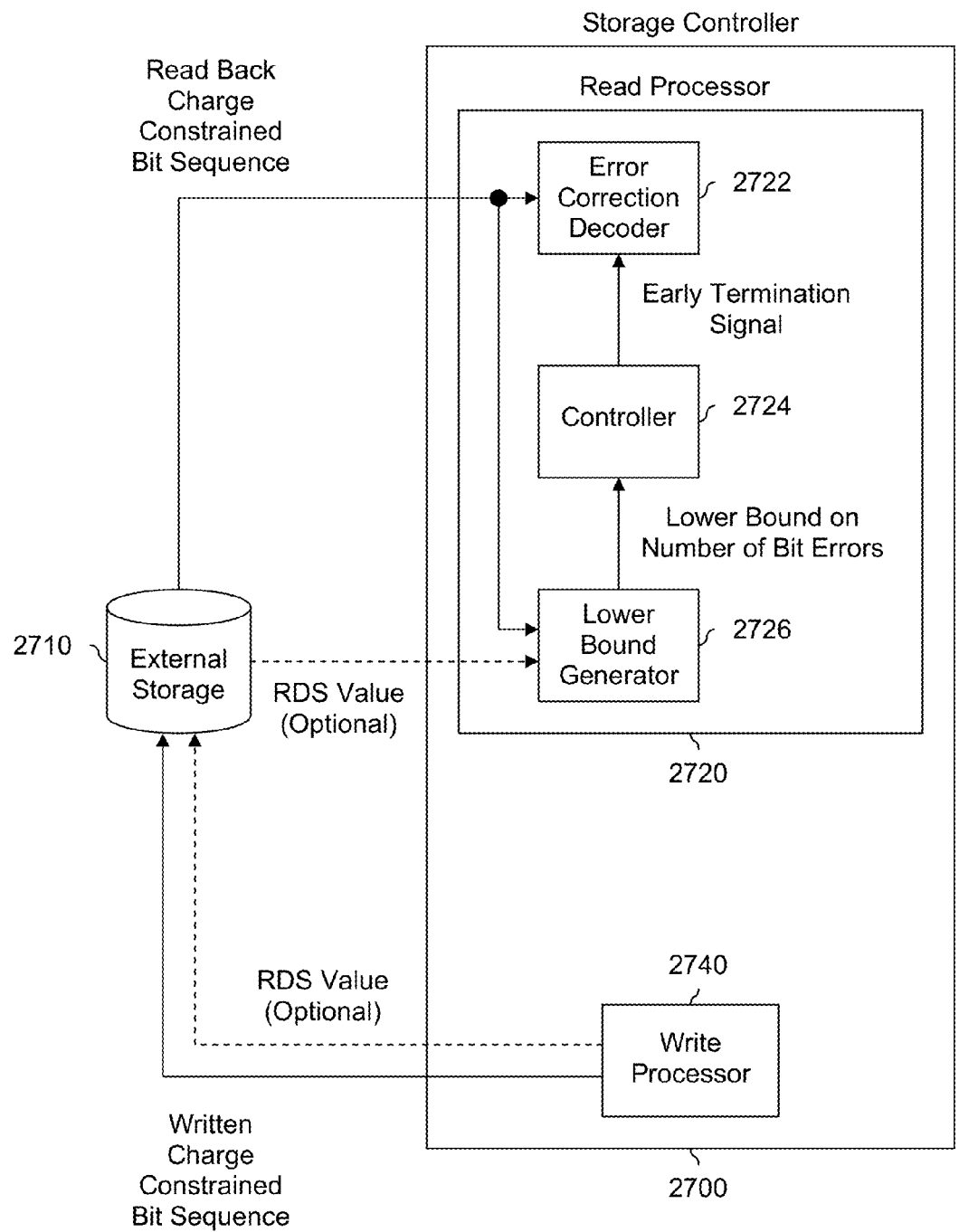
FIG. 27 is a diagram showing an embodiment of a read processor.

FIG. 27 is a diagram showing an embodiment of a read processor. In some embodiments, storage controller 2700 is implemented as a semiconductor device (e.g., an FPGA or an ASIC). In the example shown, storage controller 2700 includes write processor 2740 which writes charge constrained bit sequence to external storage 2710. For example, an RDS constraint code may be applied to the bit sequence written to external storage 2710. In some embodiments, write processor 2740 also stores an RDS value (e.g., for the bit sequence as a whole) in external storage 2710.

When the stored data is desired, read processor 2720 reads back the charge constrained bit sequence from external storage 2710. The read back charge constrained bit sequence is passed to error correction decoder 2722 and lower bound generator 2726. While error correction decoder 2722 processes the bit sequence, lower bound generator 2726 generates a lower bound on a number of bit errors. If an RDS value is stored on external storage 2710, then the stored RDS value is passed to lower bound generator 2726 where it is used in determining the lower bound. In some embodiments, lower bound generator 2726 performs the process described in FIG. 26. In some embodiments, an RDS value which is stored in external storage 2710 is error correction encoded before storage (not shown in this figure).

The lower bound is passed from lower bound generator 2726 to controller 2724. If the lower bound exceeds the error correction capability of error correction decoder 2722, then controller 2724 terminates error correction decoder 2722 early (e.g., before some maximum number of iterations is reached). If not, operation of error correction decoder 2722 is not interrupted by controller 2724. Some other examples of the actions taken by controller 2724 include canceling a future read transfer (e.g., for a remaining part of a page or codeword). For example, controller 2724 may cancel a future read of external storage 2710.

The following figure shows an example in which the technique described herein is able to terminate an error correction decoder early, whereas a simple comparison of the observed RDS value against an RDS bound would not cause the error correction decoder to be terminated early.

Figure 28:
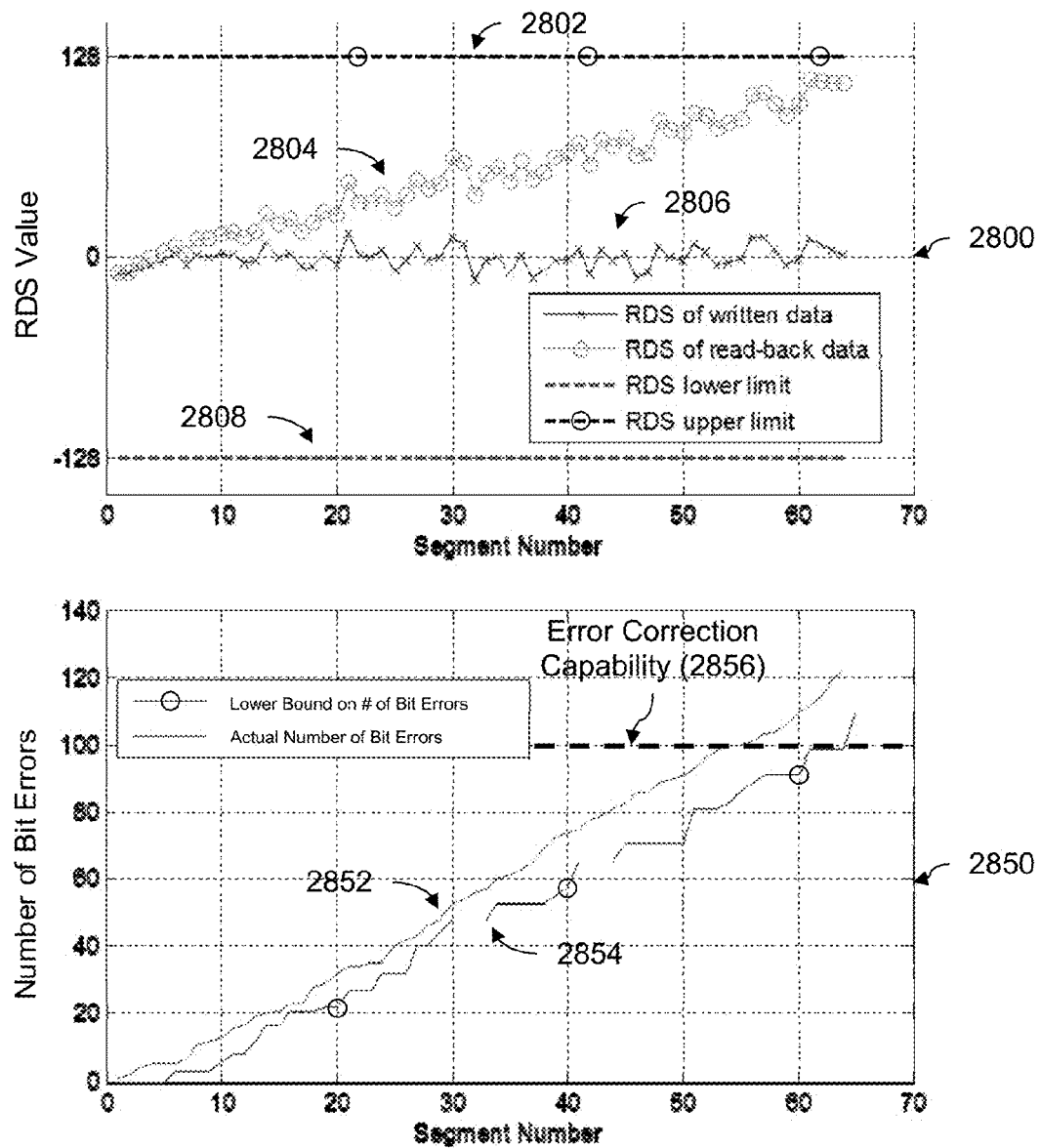
FIG. 28 is a diagram showing an embodiment of RDS values and bit errors as a function of segment numbers for a received charge constrained bit sequence.

FIG. 28 is a diagram showing an embodiment of RDS values and bit errors as a function of segment numbers for a received charge constrained bit sequence. In the example shown, graphs 2800 and 2850 show information for the same received charge constrained bit sequence. In this example, M=256 and there are 16,384 bits in the received charge constrained bit sequence. As a result, there are 64 segments, each of which is 256 bits long.

Graph 2800 shows the RDS values generated as each segment in the received bit sequence is processed. Lines 2802 and 2808 show the upper RDS bound and the lower RDS bound, respectively. In this example, M=256 so the number of excess 1s should not be greater than 128 or less than −128. Curve 2804 shows the RDS value of the received charge constrained bit sequence as segments are processed. Curve 2804 is a cumulative value and is the RDS value for all segments up to and including a given segment number. Note that the final RDS value of curve 2804 is less than RDS upper limit 2802, so a simple examination of the RDS value for the received charge constrained bit sequence would not cause an error correction decoder to be terminated earlier. To put it another way, the RDS value for the received charge constrained bit sequence falls within the permitted range of [−128, 128], so the observed RDS value would not trigger an early termination.

Graph 2850 shows a lower bound for a number of bit errors generated using the techniques described herein. Curve 2852 shows (for comparison purposes) the actual number of bit errors. Curve 2852 is cumulative, so it increases monotonically. Curve 2854 shows the lower bound on the number of bit errors and is also cumulative and increases monotonically. At the end of processing all 64 segments, the lower bound on the number of bit errors is 110. In this example, the error correction capability is 100 bits (shown as line 2856). Since the lower bound exceeds the error correction capability, an error correction decoder (which is processing the received charge constrained bit sequence associated with graphs 2800 and 2850) is terminated early. As shown in this figure, there are some cases for which the techniques described herein are able to terminate an error correction decoder early (or respond to a predicted failure in some other manner) which a basic examination of the RDS value would not catch.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
    a Viterbi-like detector configured to process a charge constrained bit sequence to obtain a lower bound on a number of bit errors associated with the charge constrained bit sequence; and
    a controller configured to:
        compare the lower bound against an error correction capability threshold associated with an error correction decoder; and
        in the event the lower bound exceeds the error correction decoder threshold:
            predict that an error correction decoding failure has occurred before a maximum number of iterations associated with the error correction decoder has been reached; and
            perform one or more of the following: (1) stop a decoding attempt associated with the error correction decoder or (2) stop a read from storage.

2. The system of claim 1, wherein the read processor includes a semiconductor device, including one or more of the following: an application-specific integrated circuit (ASIC) or a field-programmable gate array (FPGA).

3. The system of claim 1, wherein the charge constrained bit sequence includes a running digital sum (RDS) constrained bit sequence.

4. The system of claim 1, wherein:
    the charge constrained bit sequence includes a segment; and
    the Viterbi-like detector is further configured to:
        for the segment, calculating an observed number of excess 1s; and
        comparing a state with a lowest path metric against the observed number of excess 1s.

5. The system of claim 4, wherein:
    if the state is greater than or equal to 0 and the observed number of excess 1s is strictly less than 0; or
    if the state is strictly less than 0 and the number of excess 1s is greater than or equal to 0; then
    the Viterbi-like detector is further configured to update the state to be the state plus the number of excess 1s.

6. The system of claim 5, wherein else if the magnitude of the observed number of excess 1s is less than or equal to the magnitude of the state, then the Viterbi-like detector is further configured to update a placeholder lower bound to be the placeholder lower bound plus the magnitude of the number of excess 1s.

7. The system of claim 6, wherein otherwise the Viterbi-like detector is further configured to:
    update the placeholder lower bound to be the placeholder lower bound plus the magnitude of the state; and
    update the state to be the number of excess 1s.

8. The system of claim 7, wherein:
    if a running digital sum (RDS) value is saved, the Viterbi-like detector is further configured to output the placeholder lower bound plus the magnitude of the saved RDS value minus the state; and
    if the RDS value is not saved, the Viterbi-like detector is further configured to output the placeholder lower bound.

9. The system of claim 1, wherein one or more of the following applies:
    the decoding attempt includes one or more of the following: a future decoding attempt, a pending decoding attempt, or an in-progress decoding attempt; or
    the read includes one or more of the following: a future read, a pending read, or an in-progress read.

10. A method, comprising:
    using a Viterbi-like detector to process a charge constrained bit sequence to obtain a lower bound on a number of bit errors associated with the charge constrained bit sequence;
    comparing the lower bound against an error correction capability threshold associated with an error correction decoder; and
    in the event the lower bound exceeds the error correction decoder threshold:
        predicting that an error correction decoding failure has occurred before a maximum number of iterations associated with the error correction decoder has been reached; and
        performing one or more of the following: (1) stop a decoding attempt associated with the error correction decoder or (2) stop a read from storage.

11. The method of claim 10, wherein the Viterbi-like detector is implemented using a semiconductor device, including one or more of the following: an application-specific integrated circuit (ASIC) or a field-programmable gate array (FPGA).

12. The method of claim 10, wherein the charge constrained bit sequence includes a running digital sum (RDS) constrained bit sequence.

13. The method of claim 10, wherein:
    the charge constrained bit sequence includes a segment; and
    the method further includes using the Viterbi-like detector to:
        for the segment, calculate an observed number of excess 1s; and
        compare a state with a lowest path metric against the observed number of excess 1s.

14. The method of claim 10, wherein one or more of the following applies:
    the decoding attempt includes one or more of the following: a future decoding attempt, a pending decoding attempt, or an in-progress decoding attempt; or
    the read includes one or more of the following: a future read, a pending read, or an in-progress read.

15. A computer program product, the computer program product being embodied in a non-transitory computer readable storage medium and comprising computer instructions for:

using a Viterbi-like detector to process a charge constrained bit sequence to obtain a lower bound on a number of bit errors associated with the charge constrained bit sequence;

comparing the lower bound against an error correction capability threshold associated with an error correction decoder; and in the event the lower bound exceeds the error correction decoder threshold:
- predicting that an error correction decoding failure has occurred before a maximum number of iterations associated with the error correction decoder has been reached; and
- performing one or more of the following: (1) stop a decoding attempt associated with the error correction decoder or (2) stop a read from storage.

16. The method of claim 15, wherein:
if a running digital sum (RDS) value is saved, the method further includes using the Viterbi-like detector to output the placeholder lower bound plus the magnitude of the saved RDS value minus the state; and
if the RDS value is not saved, the method further includes using the Viterbi-like detector to output the placeholder lower bound.

17. The method of claim 16 further including: otherwise, using the Viterbi-like detector to:
update the placeholder lower bound to be the placeholder lower bound plus the magnitude of the state; and
update the state to be the number of excess 1s.

18. The method of claim 17 further including: else if the magnitude of the observed number of excess 1s is less than or equal to the magnitude of the state, then the method further includes using Viterbi-like detector to update a placeholder lower bound to be the placeholder lower bound plus the magnitude of the number of excess 1s.

19. The method of claim 18 further including:
if the state is greater than or equal to 0 and the observed number of excess 1s is strictly less than 0; or
if the state is strictly less than 0 and the number of excess 1s is greater than or equal to 0; then
the method further includes using the Viterbi-like detector to update the state to be the state plus the number of excess 1s.

20. The computer program product of claim 15, wherein one or more of the following applies:
the decoding attempt includes one or more of the following: a future decoding attempt, a pending decoding attempt, or an in-progress decoding attempt; or
the read includes one or more of the following: a future read, a pending read, or an in-progress read.

* * * * *